(12) United States Patent
Otake

(10) Patent No.: US 11,600,721 B2
(45) Date of Patent: Mar. 7, 2023

(54) NITRIDE SEMICONDUCTOR APPARATUS AND MANUFACTURING METHOD THEREOF

(71) Applicant: ROHM Co., LTD., Kyoto (JP)

(72) Inventor: Hirotaka Otake, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 137 days.

(21) Appl. No.: 16/913,375

(22) Filed: Jun. 26, 2020

(65) Prior Publication Data

US 2021/0005741 A1 Jan. 7, 2021

(51) Int. Cl.
*H01L 29/778* (2006.01)
*H01L 29/47* (2006.01)
(Continued)

(52) U.S. Cl.
CPC ...... *H01L 29/7787* (2013.01); *H01L 29/0649* (2013.01); *H01L 29/2003* (2013.01);
(Continued)

(58) Field of Classification Search
CPC ............ H01L 29/401; H01L 29/42316; H01L 29/205; H01L 29/66462; H01L 29/7787; H01L 29/7786; H01L 29/0649; H01L 29/475; H01L 29/2003; H01L 29/402; H01L 29/1066; H01L 27/0605; H01L 21/76283; H01L 21/8252; H01L 27/085; H01L 21/823481; H01L 29/432; H01L 21/0254; H01L 29/41758; H01L 21/0262; H01L 21/02458; H01L 29/0657; H01L 21/02389; H01L 21/02381; H01L 21/02505; H01L 21/30621; H01L 21/0273; H01L 21/32139; H01L 21/28581; H01L 21/02647; H01L 21/02639; H01L 29/0843;
(Continued)

(56) References Cited

U.S. PATENT DOCUMENTS 11,322,599 B2 * 5/2022 Neufeld .............. H01L 29/7786
2001/0017388 A1 * 8/2001 Ponomarev ....... H01L 29/78648
438/157
(Continued)

FOREIGN PATENT DOCUMENTS

JP 2017073506 A 4/2017

*Primary Examiner* — Mouloucoulaye Inoussa
(74) *Attorney, Agent, or Firm* — Chip Law Group

(57) ABSTRACT

Disclosed is a nitride semiconductor apparatus including a substrate, a first nitride semiconductor layer disposed above the substrate, and constituting an electron transit layer, a second nitride semiconductor layer formed on the first nitride semiconductor layer, and constituting an electron supply layer, a nitride semiconductor gate layer disposed on the second nitride semiconductor layer having a ridge portion at at least an area thereof, and containing an acceptor-type impurity, a gate electrode disposed on the ridge portion, a source electrode and a drain electrode disposed opposite to each other, with the ridge portion interposed therebetween, on the second nitride semiconductor layer, and a strip-shaped insulator disposed between the substrate and a surface layer portion of the first nitride semiconductor layer, and extending along a length direction of the ridge portion when viewed in plan.

30 Claims, 30 Drawing Sheets

(51) Int. Cl.
  *H01L 29/205* (2006.01)
  *H01L 29/06* (2006.01)
  *H01L 29/423* (2006.01)
  *H01L 29/66* (2006.01)
  *H01L 29/40* (2006.01)
  *H01L 29/20* (2006.01)
(52) U.S. Cl.
  CPC .......... *H01L 29/205* (2013.01); *H01L 29/401* (2013.01); *H01L 29/42316* (2013.01); *H01L 29/475* (2013.01); *H01L 29/66462* (2013.01)
(58) Field of Classification Search
  CPC ........... H01L 29/7788; H01L 21/02433; H01L 29/78; H01L 29/4966
  USPC ......... 257/76, 329, 192, 201, 367, 288, 392, 257/409, 267, E21.41, E29.089, E21.399, 257/E29.262; 438/269, 172, 168, 478, 438/285, 382, 571, 183
  See application file for complete search history.

(56) References Cited

U.S. PATENT DOCUMENTS

| | | | | |
|---|---|---|---|---|
| 2006/0124962 | A1* | 6/2006 | Ueda | H01L 29/0843 257/E29.253 |
| 2008/0203471 | A1* | 8/2008 | Otake | H01L 29/66734 438/269 |
| 2009/0050938 | A1* | 2/2009 | Miyoshi | H01L 29/517 257/E21.403 |
| 2010/0320505 | A1* | 12/2010 | Okamoto | H01L 29/41766 438/168 |
| 2011/0095336 | A1* | 4/2011 | Zundel | H01L 29/66462 257/E29.091 |
| 2011/0233623 | A1* | 9/2011 | Park | H01L 29/365 438/290 |
| 2013/0056744 | A1* | 3/2013 | Mishra | H01L 21/76 257/E29.252 |
| 2013/0320349 | A1* | 12/2013 | Saunier | H01L 29/7787 257/E21.409 |
| 2014/0008658 | A1* | 1/2014 | Siemieniec | H01L 29/1054 257/E29.089 |
| 2014/0050242 | A1* | 2/2014 | Taylor | H01L 29/0688 257/14 |
| 2014/0183598 | A1* | 7/2014 | Chiu | H01L 29/4236 257/190 |
| 2014/0264450 | A1* | 9/2014 | Chyi | H01L 29/7786 257/194 |
| 2014/0266324 | A1* | 9/2014 | Teo | H01L 29/7783 327/109 |
| 2015/0162427 | A1* | 6/2015 | Lee | H01L 29/7787 257/190 |
| 2015/0171202 | A1* | 6/2015 | Takahashi | H01L 29/66356 257/194 |
| 2015/0279982 | A1* | 10/2015 | Yamamoto | H01L 29/42368 438/172 |
| 2015/0318387 | A1* | 11/2015 | Chiu | H01L 21/0228 438/172 |
| 2016/0043210 | A1* | 2/2016 | Curatola | H01L 29/7787 257/192 |
| 2016/0071967 | A1* | 3/2016 | Prechtl | H01L 29/205 438/172 |
| 2016/0254377 | A1* | 9/2016 | Morancho | H01L 29/7783 257/76 |
| 2017/0104091 | A1* | 4/2017 | Tanaka | H01L 21/8252 |
| 2018/0033682 | A1* | 2/2018 | Chern | H01L 27/0605 |
| 2018/0061975 | A1* | 3/2018 | Tanaka | H01L 29/7786 |
| 2018/0090472 | A1* | 3/2018 | Disney | H01L 25/18 |
| 2018/0182880 | A1* | 6/2018 | Grieb | H01L 29/7787 |
| 2018/0308968 | A1* | 10/2018 | Miura | H01L 29/402 |
| 2019/0081167 | A1* | 3/2019 | Chen | H01L 29/7787 |
| 2019/0237551 | A1* | 8/2019 | Tanaka | H01L 29/7787 |

* cited by examiner

1B

1F

1G

1H

NITRIDE SEMICONDUCTOR APPARATUS AND MANUFACTURING METHOD THEREOF

CROSS REFERENCE TO RELATED APPLICATIONS

The present application claims priority benefit of Japanese Patent Application JP 2019-123779 filed in the Japan Patent Office on Jul. 2, 2019, the entire content of which is hereby incorporated by reference in its entirety.

BACKGROUND

The present disclosure relates to a nitride semiconductor apparatus formed from a group-III nitride semiconductor, which may hereinafter be simply referred to as "nitride semiconductor," and also to a manufacturing method thereof.

The term "group-III nitride semiconductor" means a semiconductor that uses nitrogen as a group-V element in a group III-V semiconductor. Representative examples include aluminum nitride (AlN), gallium nitride (GaN), and indium nitride (InN). In general, a group-III nitride semiconductor can be represented by $Al_xIn_yGa_{1-x-y}N$ ($0 \le x \le 1$, $0 \le y \le 1$, $0 \le x+y \le 1$).

High electron mobility transistors (HEMTs) using such nitride semiconductors have been proposed. Such an HEMT includes, for example, an electron transit layer formed from GaN, and an electron supply layer formed from AlGaN and epitaxially grown on the electron transit layer. A pair of source and drain electrodes is formed in contact with the electron supply layer, and a gate electrode is disposed between these source and drain electrodes.

Due to polarization caused by a lattice mismatch between GaN and AlGaN, a two-dimensional electron gas is formed in the electron transit layer at a position inward by several Å from an interface between the electron transit layer and the electron supply layer. The source and the drain are connected through the two-dimensional electron gas as a channel. When the two-dimensional electron gas is blocked by applying a control voltage to the gate electrode, the source and the drain are disconnected from each other. With no control voltage applied to the gate electrode, the source and the drain remain conducted with each other so that the HEMT functions as a normally-on type device.

Devices with a nitride semiconductor employed therein have characteristics such as high voltage resistance, high-temperature operation, large current density, high-speed switching and low on-resistance, and their application to power devices is proposed in JP 2017-73506 A. At present, devices of such a concept are manufactured on a mass scale, and are distributed in the market.

Japanese Patent Laid-Open No. 2017-73506 discloses a configuration to achieve a normally-off scheme. A ridge-shaped p-type GaN gate layer (nitride semiconductor gate layer) is stacked on an AlGaN electron supply layer, and a gate electrode is disposed on the p-type GaN gate layer. A channel is lost by a depletion layer spreading from the p-type GaN gate layer.

SUMMARY

A normally-off device using a p-type GaN gate layer, however, has a problem in that its positive-going gate rated voltage is low. As a cause of this problem, due to crystal defects in the p-type GaN gate layer, a Schottky junction formed between the p-type GaN gate layer and the gate electrode formed thereon includes a region where the barrier height for holes is locally small, and a current leakage path is hence formed there. As another cause of the problem, there is a phenomenon that a metal material in the gate electrode may diffuse into the p-type GaN gate layer, especially into its defect region when heated, whereby barrier properties may be locally weakened to form a current leakage path.

It is desirable to provide a nitride semiconductor apparatus, which allows to increase a positive-going gate rated voltage, and a manufacturing method thereof.

In a first aspect of the present disclosure, there is provided a nitride semiconductor apparatus including a substrate, a first nitride semiconductor layer disposed above the substrate, and constituting an electron transit layer, a second nitride semiconductor layer formed on the first nitride semiconductor layer, and constituting an electron supply layer, a nitride semiconductor gate layer disposed on the second nitride semiconductor layer having a ridge portion at at least an area thereof, and containing an acceptor-type impurity, a gate electrode disposed on the ridge portion, a source electrode and a drain electrode disposed opposite to each other, with the ridge portion interposed therebetween, on the second nitride semiconductor layer, and a strip-shaped insulator disposed between the substrate and a surface layer portion of the first nitride semiconductor layer, and extending along a length direction of the ridge portion when viewed in plan. The insulator is disposed below the gate electrode. The insulator has a width greater than twice a width of a bottom surface of the gate electrode.

According to the configuration described above, the gate electrode can be disposed in a region other than a position right above crystal defects to be formed in the ridge portion. This allows to eliminate a gate leakage current via an imperfect junction of a defect region or a leakage path, and also allows to suppress the metal material, which includes the gate electrode, from diffusing into the ridge portion. As a consequence, the gate rated voltage can be increased.

Preferably, when one of side edges of the insulator is assumed to be a first side edge and another side edge of the insulator is assumed to be a second side edge, the bottom surface of the gate electrode may be disposed right above an intermediate region between the first side edge and a widthwise center of the insulator or right above an intermediate region between the second side edge and the widthwise center, and the bottom surface of the gate electrode may not exist right above any of the first side edge, the widthwise center and the second side edge in the insulator.

Preferably, when viewed in plan, the first side edge and the widthwise center may exist inside both opposite side edges of the ridge portion, or the second side edge and the widthwise center may exist inside both the opposite side edges of the ridge portion.

Preferably, when viewed in plan, only one of the first side edge, the widthwise center and the second side edge of the insulator may exist inside both opposite side edges of the ridge portion.

Preferably, when one of side edges of the insulator is assumed to be a first side edge and another side edge of the insulator is assumed to be a second side edge, the ridge portion may have a bottom surface disposed right above an intermediate region between the first side edge and a widthwise center of the insulator or right above an intermediate region between the second side edge and the widthwise center, and the bottom surface of the ridge portion may not exist right above any of the first side edge, the widthwise center and the second side edge in the insulator.

Preferably, when viewed in plan, the nitride semiconductor gate layer may be disposed to surround a main portion of the source electrode, and when viewed in plan, a distance between a side edge of the insulator, the side edge being on a side of the drain electrode, and a widthwise center of the ridge portion may be greater than a distance between a side edge of the insulator, the side edge being on a side of the source electrode, and the widthwise center of the ridge portion.

Preferably, the nitride semiconductor gate layer may have an extension region extending outward beyond a region where the source electrode and the drain electrode oppose each other, and in the extension region, a region where the nitride semiconductor gate layer and the gate electrode are out of contact may have a greater area than a region where the nitride semiconductor gate layer and the gate electrode are in contact with each other.

Preferably, the gate electrode may be in Schottky contact with a surface of the nitride semiconductor gate layer.

Preferably, when the nitride semiconductor gate layer is assumed to be a first nitride semiconductor gate layer, a second nitride semiconductor gate layer having a greater band gap than the first nitride semiconductor gate layer may be formed on the first nitride semiconductor gate layer, the gate electrode may be formed on the second nitride semiconductor gate layer, and the gate electrode may be in contact with a surface of the second nitride semiconductor gate layer.

Preferably, the width of the insulator may be 3 μm or smaller.

Preferably, the width of the insulator may be 2 μm or smaller.

Preferably, the insulator may be formed from one of $SiO_2$, SiN, SiON, $Al_2O_3$, AlN, or AlON.

In a second aspect of the present disclosure, there is provided a manufacturing method of a nitride semiconductor apparatus. The manufacturing method includes a first step of forming, above a substrate, an insulator extending in a predetermined first direction and having a strip shape when viewed in plan, a second step of forming, on the substrate, a first nitride semiconductor layer constituting an electron transit layer such that the first nitride semiconductor layer covers the insulator, a third step of forming, on the first nitride semiconductor layer, a second nitride semiconductor layer constituting an electron supply layer, a fourth step of forming, on the second nitride semiconductor layer, a gate layer material film that is a material film for a nitride semiconductor gate layer containing an acceptor-type impurity, a fifth step of forming, on the gate layer material film, a gate electrode film that is a material film for the gate electrode, and a sixth step of patterning the gate electrode film and the gate layer material film to form, on the second nitride semiconductor layer, the nitride semiconductor gate layer and the gate electrode such that the nitride semiconductor gate layer has a ridge-shaped ridge portion extending in the first direction and the gate electrode is disposed on a widthwise intermediate area of a surface of the ridge portion. In the sixth step, the gate electrode film and the gate layer material film are patterned such that, when one of side edges of the insulator is assumed to be a first side edge and another side edge of the insulator is assumed to be a second side edge, a bottom surface of the gate electrode is disposed right above an intermediate region between the first side edge and a widthwise center of the insulator or right above an intermediate region between the widthwise center, and the second side edge, and the bottom surface of the gate electrode does not exist right above any of the first side edge, the widthwise center, and the second side edge in the insulator.

According to the manufacturing method described above, a nitride semiconductor apparatus which allows to increase the gate rated voltage can be manufactured.

Preferably, the sixth step may include forming the gate electrode by etching the gate electrode film while using, as a mask, a first insulating film formed at a predetermined region on the gate electrode, forming second insulating films on both opposite side surfaces of the gate electrode, respectively, forming the semiconductor gate layer by etching the gate layer material film while using the first insulating film and the second insulating film as masks such that the second nitride semiconductor layer is exposed at a surface thereof, and removing the first insulating film and the second insulating film.

In a third aspect of the present disclosure, there is provided a manufacturing method of a nitride semiconductor apparatus. The manufacturing method includes a first step of forming, above a substrate, an insulator extending in a predetermined first direction and having a strip shape when viewed in plan, a second step of forming, on the substrate, a first nitride semiconductor layer constituting an electron transit layer such that the first nitride semiconductor layer covers the insulator, a third step of forming, on the first nitride semiconductor layer, a second nitride semiconductor layer constituting an electron supply layer, a fourth step of forming, on the second nitride semiconductor layer, a gate layer material film that is a material film for a nitride semiconductor gate layer containing an acceptor-type impurity, a fifth step of forming a third insulating film on the gate layer material film, a sixth step of forming, in the third insulating film, a gate opening portion that extends in the first direction through the third insulating film, a seventh step of forming, on the gate layer material film, a gate electrode film that is a material film for the gate electrode, such that the gate electrode film covers the gate opening portion, and an eighth step of patterning the gate electrode film, the third insulating film, and the gate layer material film to form, on the second nitride semiconductor layer, the nitride semiconductor gate layer, a pair of third insulating layers, and the gate electrode such that the nitride semiconductor gate layer includes the gate opening when viewed in plan and has a ridge-shaped ridge portion extending in the first direction, the pair of third insulating layers is disposed on both opposite side areas of a surface of the ridge portion with the gate opening portion interposed therebetween, and the gate electrode is formed with the gate opening portion covered by the gate electrode. In the eighth step, the gate electrode film and a gate insulating material are patterned such that, when one of side edges of the insulator is assumed to be a first side edge and another side edge of the insulator is assumed to be a second side edge, a bottom surface of the gate electrode is disposed right above an intermediate region between the first side edge and a widthwise center of the insulator or right above an intermediate region between the second side edge, and a widthwise center of the insulator, and the widthwise center, and the bottom surface of the gate electrode does not exist right above any of the first side edge, the widthwise center, and the second side edge in the insulator.

According to the manufacturing method described above, a nitride semiconductor apparatus which allows to increase the gate rated voltage can be manufactured.

DETAILED DESCRIPTION OF THE PREFERRED EMBODIMENTS

Embodiments of the present disclosure will hereinafter be described in detail with reference to the accompanying drawings.

Figure 1:
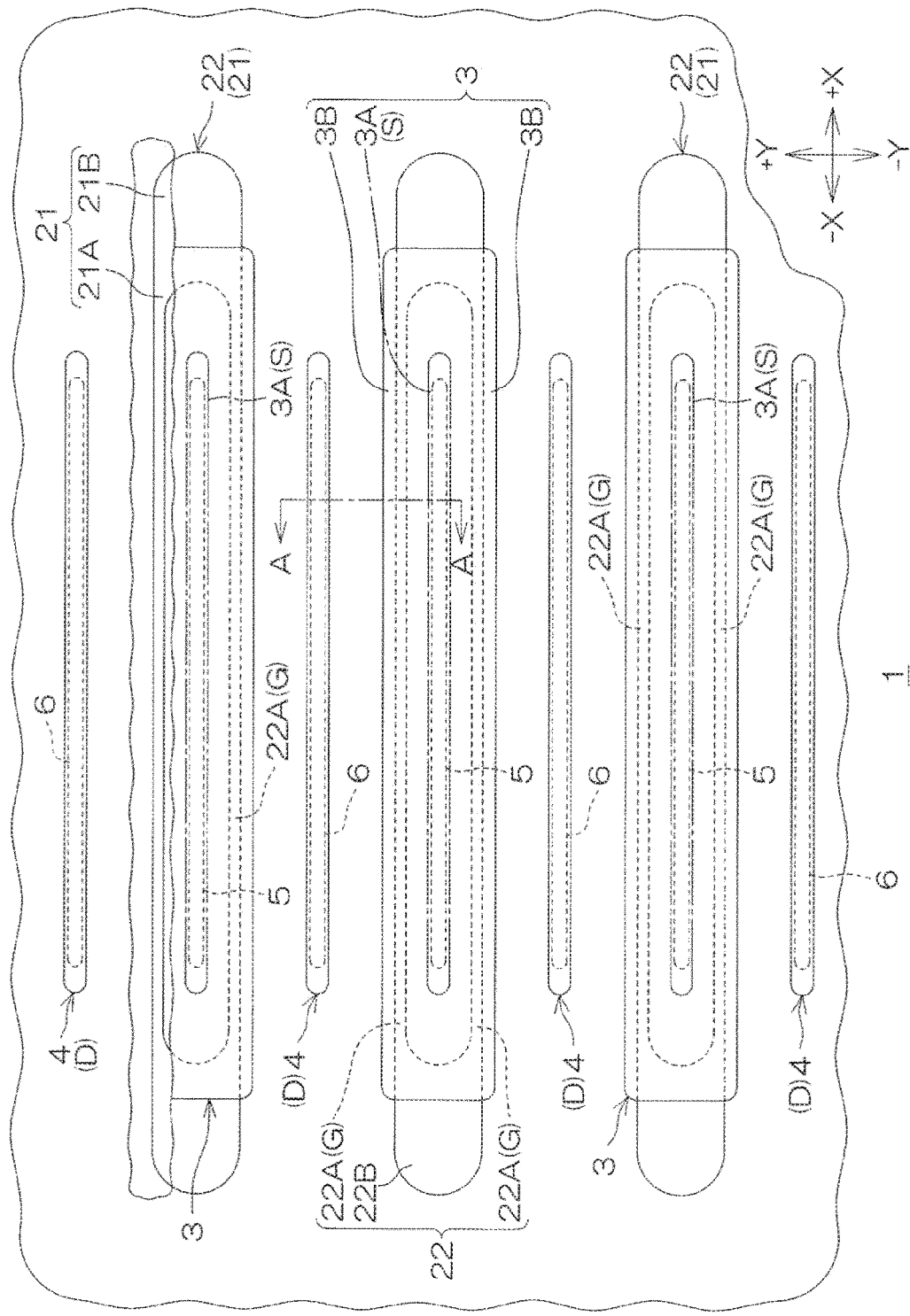
FIG. 1 is a fragmentary plan view for describing a configuration of a nitride semiconductor apparatus according to a first embodiment of the present disclosure.
Figure 2A:
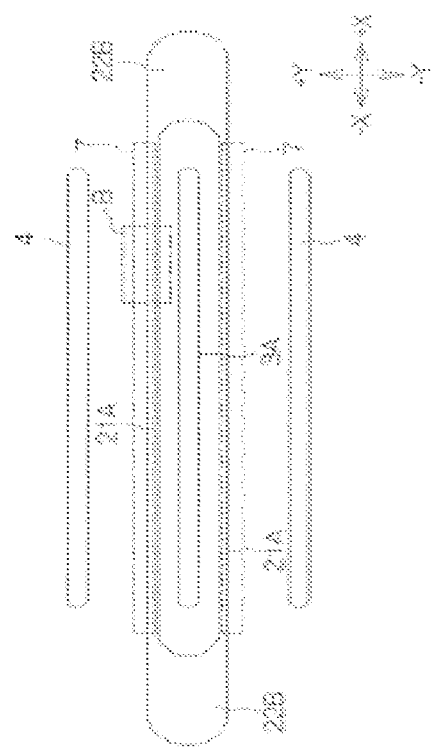
FIG. 2A is a partial plan view for describing a relative positional relation between a main gate electrode portion and an insulator in the nitride semiconductor apparatus of FIG. 1.
Figure 2B:
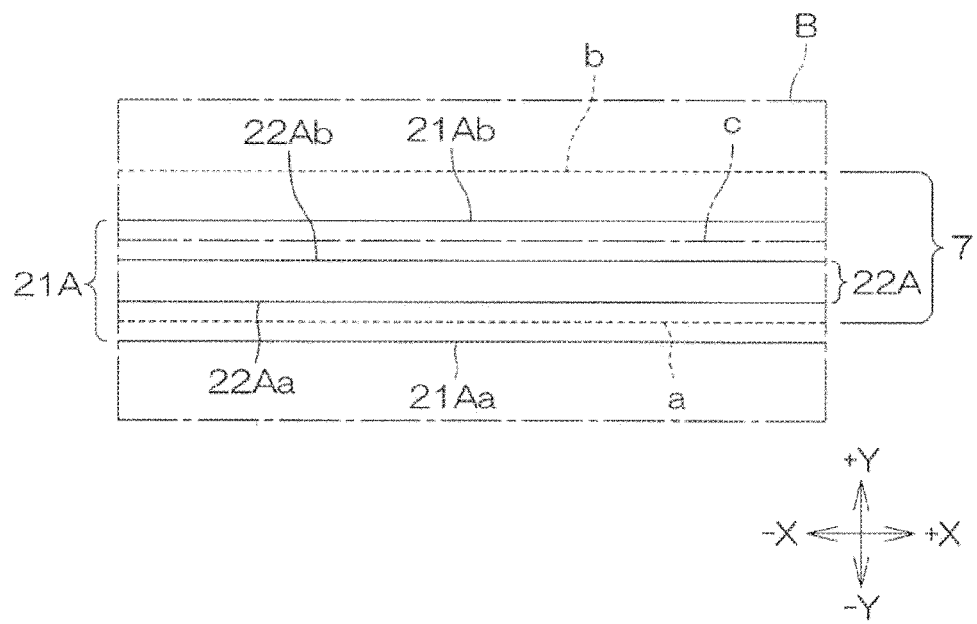
FIG. 2B is an enlarged partial view of a region B in FIG. 2A.
Figure 3:
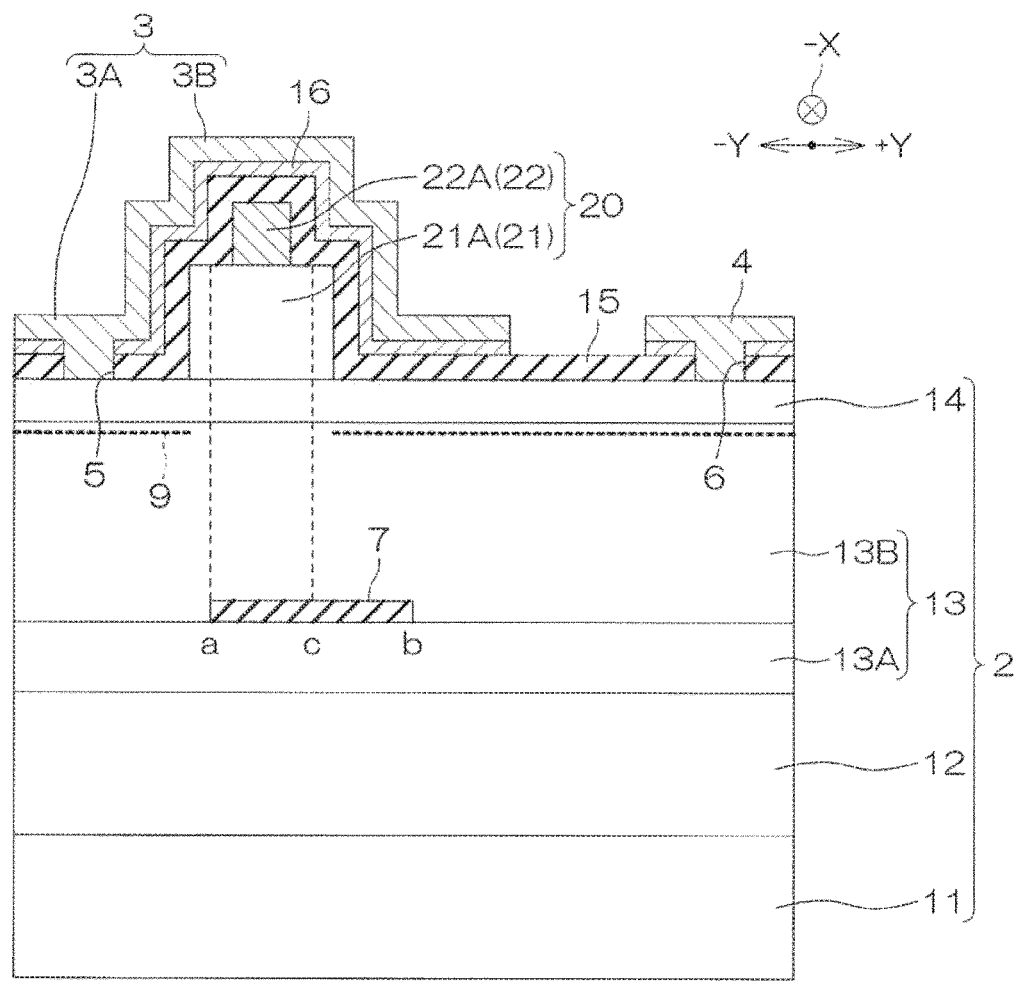
FIG. 3 is an enlarged cross-sectional view taken along line A-A of FIG. 1.

FIG. 1 is a fragmentary plan view for describing the configuration of a nitride semiconductor apparatus according to a first embodiment of the present disclosure. FIG. 2A is a partial plan view for describing the relative positional relation between a main gate electrode portion and an insulator in the nitride semiconductor apparatus of FIG. 1. FIG. 2B is an enlarged partial view of a region B in FIG. 2A. FIG. 3 is an enlarged cross-sectional view taken along line A-A of FIG. 1.

It is to be noted that in FIG. 1, a passivation film 15 and a barrier metal film 16 are omitted for the sake of convenience of description. Also, in FIG. 2A, as a source electrode 3, only a main source electrode portion 3A is presented, and a spread-out portion 3B is omitted. Further, as will be described subsequently herein, each ridge portion 21A in a semiconductor gate layer 21 has a width greater than a corresponding main gate electrode portion 22A in a gate electrode 22. In FIGS. 1 and 2A, however, the ridge portion 21A is illustrated as having a width equal to that of the main gate electrode portion 22A.

For the sake of convenience of description, a +X direction, −X direction, +Y direction and −Y direction indicated in FIGS. 1, 2A, 2B and 3 may hereinafter be used. When viewed in plan, the +X direction is a predetermined direction extending along a surface of the nitride semiconductor apparatus 1, and the +Y direction is a direction extending along the surface of the nitride semiconductor apparatus 1 and intersecting the +X direction at right angles. The −X direction is a direction opposite to the +X direction, and the −Y direction is a direction opposite to the +Y direction. The +X direction and −X direction may be simply called "the X direction" when called collectively. The +Y direction and −Y direction may be simply called "the Y direction" when called collectively.

The nitride semiconductor apparatus 1 includes a semiconductor stack structure 2, and an electrode metal structure disposed on the semiconductor stack structure 2.

As illustrated in FIG. 1, the electrode metal structure includes a plurality of source electrodes 3, a plurality of gate electrodes 22, and a plurality of drain electrodes 4. The source electrodes 3 and the drain electrodes 4 extend in the X direction.

Each gate electrode 22 includes a pair of main gate electrode portions 22A extending in parallel to each other in the X direction, and two base portions 22B connecting corresponding end portions of the paired main gate electrode portions 22A.

Each source electrode 3 is formed so that when viewed in plan, it covers the paired main gate electrode portions 22A of the gate electrode 22. When viewed in plan, the source electrode 3 is formed of a main source electrode portion 3A disposed between lengthwise intermediate portions of the paired main gate electrode portions 22A of the gate electrode 22, and the spread-out portion 3B around the main source electrode portion 3A. The term "main source electrode portion 3A" as used in this embodiment shall mean, out of the entire region of the source electrode 3, 3A region consisting of a region, which is surrounded by a contour of a source contact hole 5, and its peripheral region when viewed in plan. The term "spread-out portion 3B" means a portion other than the main source electrode portion 3A out of the entire region of the source electrode 3 when viewed in plan. The spread-out portion 3B covers the paired main gate electrode portions 22A and portions of the two base portions 22B of the gate electrode 22 when viewed in plan.

On opposite sides of each source electrode 3, the drain electrodes 4 are disposed, respectively. When viewed in plan, each drain electrode 4 and its adjacent main source electrode portion 3A face each other with the corresponding main gate electrode portion 22A of the gate electrode 22 being interposed therebetween. In this embodiment, the drain electrode 4 has a length substantially equal to that of the main source electrode portion 3A, so that the positions in the X direction of opposite ends of the drain electrode 4 substantially coincide the positions in the X-direction of corresponding opposite ends of the drain electrode 4.

In the example of FIG. 1, the main source electrode portions 3A(S), the main gate electrode portions 22A(G) and the drain electrodes 4(D) are repeatedly disposed in the order of DGSGDGS in the Y direction. Therefore, a device structure is configured with each main gate electrode portion 22A(G) flanked between its adjacent main source electrode portion 3A(S) and drain electrode 4(D).

The base portions 22B of the gate electrode 22 connect the corresponding ends of the paired main gate electrode portions 22A, respectively.

As illustrated in FIG. 3, the semiconductor stack structure 2 includes a substrate 11, a buffer layer 12 formed on a surface of the substrate 11, a first nitride semiconductor layer 13 epitaxially grown on the buffer layer 12, and a second nitride semiconductor layer 14 epitaxially grown on the first nitride semiconductor layer 13.

The substrate 11 may be, for example, a low-resistance silicon substrate. The low-resistance silicon substrate may be a p-type substrate having an electrical resistivity of, for example, 0.001 to 0.5 Ωmm (more specifically, 0.01 to 0.1 Ωmm or so). Besides such a low-resistance silicon substrate, the substrate 11 may also be a low-resistance SiC substrate, a low-resistance GaN substrate, or the like. The thickness of the substrate 11 is, for example, 650 μm or so during a semiconductor manufacturing method, and is ground to approximately 300 μm or less in a stage before being diced into chips. The substrate 11 is electrically connected to the source electrode 3.

In this embodiment, the buffer layer 12 is formed of a multilayer buffer layer made of a plurality of nitride semiconductor layers stacked one over the other or another. In this embodiment, the buffer layer 12 is configured of a first buffer layer (not illustrated in any figure) and a second buffer layer (not illustrated in any figure). The first buffer layer is in contact with a surface of the substrate 11, and is formed of an AlN film. The second buffer layer is stacked on a surface of the first buffer layer (a surface on a side opposite the substrate 11), and is formed of an AlN/AlGaN superlattice layer. The first buffer layer has a thickness of 100 to 500 nm or so. The second buffer layer has a thickness of 500 nm to 2 μm or so. The buffer layer 12 may be formed of a single film or composite film of AlGaN.

The first nitride semiconductor layer 13 includes an electron transit layer. The first nitride semiconductor layer 13 is formed of a GaN layer, which has a thickness of 0.5 to 2 μm or so. In this embodiment, the first nitride semiconductor layer 13 is formed of a lower layer 13A formed on the buffer layer 12, and an upper layer 13B formed on the lower layer 13A. Here, in order to suppress a leakage current that may flow through the first nitride semiconductor layer 13, an impurity may be introduced into a region of the upper layer 13B other than a surface layer portion thereof in the first nitride semiconductor layer 13 so that the region is provided with semi-insulating properties. If this is the case, the concentration of the impurity may preferably be $4 \times 10^{16}$ cm$^{-3}$ or higher. The impurity may be, for example, C or Fe.

The second nitride semiconductor layer 14 includes an electron supply layer. The second nitride semiconductor layer 14 is formed from a nitride semiconductor having a greater band gap than the first nitride semiconductor layer 13. In this embodiment, the second nitride semiconductor layer 14 is formed from a nitride semiconductor having a higher Al composition than the first nitride semiconductor layer 13. In a nitride semiconductor, the higher the Al composition, the greater the band gap. In this embodiment, the second nitride semiconductor layer 14 is formed of an $Al_{x1}Ga_{1-x1}N$ layer (0<x1<1), and has a thickness of 5 to 25 nm or so.

As described above, the first nitride semiconductor layer (electron transit layer) 13 and the second nitride semiconductor layer (electron supply layer) 14 are formed from nitride semiconductors having different band gaps (Al composition), and a lattice mismatch has occurred between them. By spontaneous polarization in the first nitride semiconductor layer 13 and the second nitride semiconductor layer 14 and piezoelectric polarization arisen from a lattice mismatch between them, a conduction band of the first nitride semiconductor layer 13 at an interface between the first nitride semiconductor layer 13 and the second nitride semiconductor layer 14 has an energy level lower than the Fermi level. Therefore, a two-dimensional electron gas (2DEG) 9 spreads in the surface layer portion of the first nitride semiconductor layer 13 (the upper layer 13B) at a position close to the interface between the first nitride semiconductor layer 13 and the second nitride semiconductor layer 14 (for example, at a distance of several Å or so from the interface).

The expression "the surface layer portion of the first nitride semiconductor layer 13 (the upper layer 13B)" as used herein means a region, which is a surface region in the first nitride semiconductor layer 13 and includes a two-dimensional electron gas forming region.

On the lower layer 13A of the first nitride semiconductor layer 13, an insulator 7 of a strip shape when viewed in plan is formed extending in the X direction. The upper layer 13B is formed on the lower layer 13A to cover the insulator 7. In this embodiment, the insulator 7 is formed from SiN. The insulator 7 may also be formed from $SiO_2$, SiON, $Al_2O_3$, AlN, AlON or the like. The insulator 7 is arranged to control (define) the positions of crystal defects to be formed in the semiconductor gate layer 21 which will be described subsequently herein.

Between the second nitride semiconductor layer 14 and the gate electrode 22, the semiconductor gate layer (nitride semiconductor gate layer) 21 is interposed. The semiconductor gate layer 21 is formed by epitaxial growth on a surface of the second nitride semiconductor layer 14. The semiconductor gate layer 21 has substantially the same shape as the gate electrode 22 when viewed in plan. Described specifically, the semiconductor gate layer 21 includes a pair of ridge portions 21A extending in parallel to each other in the X direction and two connecting portions 21B connecting corresponding end portions of the paired ridge portions 21A.

The gate electrode 22 is formed on the semiconductor gate layer 21. The paired main gate electrode portions 22A of the gate electrode 22 are formed on the paired ridge portions 21A of the semiconductor gate layer 21. The two base portions 22B of the gate electrode 22 are formed on the two connecting portions 21B of the semiconductor gate layer 21.

As illustrated in FIGS. 1 and 2, the semiconductor gate layer 21 and the gate electrode 22 are each formed in a ring shape (closed curve shape) when viewed in plan. As illustrated in FIG. 3, a ridge-shaped gate portion 20 is formed by each ridge portion 21A of the semiconductor gate layer 21 and its corresponding main gate electrode portion 22A(G) formed on the ridge portion 21A.

The ridge portion 21A and main gate electrode portion 22A each have a rectangular transverse cross-section. The main gate electrode portion 22A has a width smaller than the ridge portion 21A. The main gate electrode portion 22A is formed on a widthwise intermediate area on an upper surface of the ridge portion 21A. Accordingly, a step is formed between an upper surface of the main gate electrode portion 22A and an upper surface of a side portion of the ridge portion 21A, and another step is formed between the upper surface of the main gate electrode portion 22A and an upper surface of an opposite side portion of the ridge portion 21A. Further, opposite side edges of the main gate electrode portion 22A inwardly recede from their corresponding side edges of the ridge portion 21A when viewed in plan.

In this embodiment, the gate electrode 22 is in Schottky contact with the upper surface of the semiconductor gate layer 21. The gate electrode 22 is formed from TiN. The gate electrode 22 has a thickness of 50 to 150 nm or so. The gate electrode 22 may be formed of one single film out of a Ti film, TiN film and TiW film or a composite film including a desired combination of two or more of these films.

The semiconductor gate layer 21 is formed from a nitride semiconductor doped with an acceptor-type impurity. In this embodiment, the semiconductor gate layer 21 is formed of a GaN layer (p-type GaN layer) doped with an acceptor-type impurity, and has a thickness of 40 to 150 nm or so. The concentration of the acceptor-type impurities to be implanted into the semiconductor gate layer 21 may preferably be $1\times10^{19}$ $cm^{-3}$ or higher. In this embodiment, the acceptor-type impurity is Mg (magnesium). The acceptor-type impurity may also be an acceptor-type impurity other than Mg, such as Zn (zinc).

The semiconductor gate layer 21 is arranged to change the energy level of the conduction band in a region right below the gate portion 20 at the interface between the first nitride semiconductor layer 13 and the second nitride semiconductor layer 14 so that the two-dimensional electron gas 9 does not occur in the region right below the gate portion 20 in a state where no gate voltage is applied.

Referring to FIG. 3, the insulator 7 is disposed below the main gate electrode portion 22A (gate portion 20). The insulator 7 is formed with a width greater than twice the width of a bottom surface of the main gate electrode portion 22A.

The insulator 7 may have a width of preferably 3 µm or smaller, more preferably 2 µm or smaller for a reason to be described. Upon formation of the upper layer 13B on the lower layer 13A, GaN is formed by lateral growth at a position above the insulator 7. If the width of the insulator 7 is greater than 3 µm, however, there is a potential problem that GaN may not be allowed to undergo sufficient crystal growth at a position above a center of the insulator 7. Nonetheless, the width of the insulator 7 may also be greater than 3 µm.

If the insulator 7 is arranged as described above, crystal defects are known to appear right above a first side edge a of the insulator 7, the side edge a being on the side of the main source electrode portion 3A, a second side edge b of the insulator 7, the side edge b being on the side of the drain electrode 4, and a widthwise center c of the insulator 7. In other words, crystal defects appear in the upper layer 13B, the second nitride semiconductor layer 14 and the semiconductor gate layer 21 (ridge portions 21A) at positions right above the first side edge a, second side edge b and widthwise center c of the insulator 7, respectively.

This embodiment is characterized by the arrangement of the main gate electrode portion 22A in a region other than the positions right above crystal defects that occur in the ridge portion 21A, whereby a gate leakage current via an imperfect junction of a defect region or a leakage path is eliminated, a metal material which includes the main gate electrode portion 22A is suppressed from diffusing into the ridge portion 21A, and hence the gate rated voltage is increased. A description will hereinafter be made in detail about this characteristic feature.

In this embodiment, when viewed in plan as illustrated in FIGS. 2B and 3, the first side edge a and the widthwise center c of the insulator 7 exist inside opposite side edges 21Aa and 21Ab of the ridge portion 21A, but the second side edge b of the insulator 7 exists on an outer side than the side edge 21Ab, which corresponds to the second side edge b, of the ridge portion 21A.

When view in plan, an interval between the ridge portion 21A and the main source electrode portion 3A is narrower than an interval between the ridge portion 21A and the drain electrode 4. If the insulator 7 protrudes outward from one of the opposite side edges 21Aa and 21Ab of the ridge portion 21A when viewed in plan, the insulator 7 may hence preferably protrude toward the drain electrode 4. If the insulator 7 protrudes outward from the opposite side edges 21Aa and 21Ab of the ridge portion 21A when viewed in plan, on the other hand, the amount of protrusion toward the source electrode 3 may preferably be small compared with the amount of protrusion toward the drain electrode 4.

In this embodiment, the insulator 7 is disposed from such viewpoints so that when viewed in plan, a distance between the side edge b of the insulator 7, the side edge b being on the side of the drain electrode 4, and a widthwise center of the ridge portion 21A is greater than a distance between the side edge a of the insulator 7, the side edge a being on the side of the source electrode 3 and the widthwise center of the ridge portion 21A.

In this embodiment, as illustrated in FIG. 3, the bottom surface of the main gate electrode portion 22A is disposed right above an intermediate region between the first side edge a and the widthwise center c of the insulator 7. In other words, when viewed in plan as illustrated in FIG. 2B, a side edge 22Aa of the main gate electrode portion 22A, the side edge 22Aa corresponding to the first side edge a of the insulator 7, is disposed inside relative to the first side edge a, and a side edge 22Ab of the main gate electrode portion 22A, the side edge 22Ab corresponding to the second side edge b of the insulator 7, is disposed inside the widthwise center c of the insulator 7 (on the side of the first side edge a).

Therefore, the bottom surface of the main gate electrode portion 22A does not exist right above any of the first side edge a, widthwise center c and second side edge b of the insulator 7. Therefore, the bottom surface of the main gate electrode portion 22A is disposed in a region other than the positions right above crystal defects in the ridge portion 21A, thereby allowing to increase the gate rated voltage.

As illustrated in FIG. 3, on the second nitride semiconductor layer 14, the passivation film 15 is formed covering exposed surfaces of the second nitride semiconductor layer 14, semiconductor gate layer 21 and gate electrode 22. Therefore, the gate portion 20 is covered at side surfaces and a top surface thereof by the passivation film 15. In this embodiment, the passivation film 15 is formed of a SiN film, and its thickness is 50 to 200 nm or so. The passivation film 15 may be formed of a single film of one of SiN, $SiO_2$ and SiON or a composite film formed from a desired combination of two or more of them.

On the passivation film 15, the barrier metal film 16 is formed. The barrier metal film 16 is formed to prevent a metal material, which includes the source electrode 3 and the drain electrode 4, from diffusing into the passivation film 15.

Through the barrier metal film 16 and the passivation film 15, a source contact hole 5 and a drain contact hole 6 are formed. The source contact hole 5 and the drain contact hole 6 are formed in an arrangement in which the gate portion 20 is interposed therebetween.

The main source electrode portion 3A of the source electrode 3 extends through the source contact hole 5, and is in contact with the second nitride semiconductor layer 14. As illustrated in FIGS. 1 and 3, the spread-out portion 3B of the source electrode 3 covers the gate portion 20. As illustrated in FIG. 1, the spread-out portion 3B of the source electrode covers portions of the base portions 22B of the gate electrode 22. The drain electrode 4 extends through the drain contact hole 6, and is in contact with the second nitride semiconductor layer 14.

The source electrode 3 and the drain electrode 4 are each formed, for example, of a first metal layer (ohmic metal layer) in contact with the second nitride semiconductor layer 14, a second metal layer (main electrode metal layer) stacked on the first metal layer, a third metal layer (adhesion layer) stacked on the second metal layer, and a fourth metal layer (barrier metal layer) stacked on the third metal layer. The first metal layer is, for example, a Ti layer having a thickness of 10 to 20 nm or so. The second metal layer is, for example, an AlCu layer having a thickness of 100 to 300 nm or so. The third metal layer is, for example, a Ti layer having a thickness of 10 to 20 nm or so. The fourth metal layer is, for example, a TiN layer having a thickness of 10 to 50 nm or so.

In this nitride semiconductor apparatus 1, the second nitride semiconductor layer (electron supply layer) 14 that is different in band gap (Al composition) from the first nitride semiconductor layer (electron transit layer) 13 is formed on the first nitride semiconductor layer (electron transit layer) 13 to provide a hetero junction. This hetero junction allows to form the two-dimensional electron gas 9 in the first nitride semiconductor layer 13 at a position near the interface between the first nitride semiconductor layer and the second nitride semiconductor layer 14, thereby forming a HEMT that uses the two-dimensional electron gas 9 as a channel. Each main gate electrode portion 22A of the gate electrode 22 faces the second nitride semiconductor layer with the corresponding ridge portion 21A of the semiconductor gate layer 21 interposed therebetween.

Below the main gate electrode portion 22A, the energy levels of the first nitride semiconductor layer 13 and the second nitride semiconductor layer 14 are raised by an ionized acceptor contained in the ridge portion 21A formed of the p-type GaN layer. As a consequence, the energy level of the conduction band at the heterojunction interface between the first nitride semiconductor layer 13 and the second nitride semiconductor layer 14 becomes higher than the Fermi level. Right below the main gate electrode portion 22A (gate portion 20), there is hence formed no two-dimensional electron gas 9 which would otherwise occur by spontaneous polarization in the first nitride semiconductor layer 13 and the second nitride semiconductor layer 14 and piezoelectric polarization arisen from a lattice mismatch between them.

When no bias is applied to the gate electrode 22 (at zero bias), the channel of the two-dimensional electron gas 9 is therefore blocked right below the main gate electrode portion 22A. As a consequence, the normally-off type HEMT has been realized. When an appropriate on-voltage (for example, 5 V) is applied to the gate electrode 22, a channel is induced in the first nitride semiconductor layer 13 at a position right below the main gate electrode portion 22A so that the two-dimensional electron gas 9 on one side of the main gate electrode portion 22A and the two-dimensional electron gas 9 on the other side of the main gate electrode portion 22A are connected via the induced channel. Source-drain conduction is established accordingly.

When using, a predetermined voltage (for example, 50 V to 100 V) which is positive on the side of the drain electrode 4 is applied between the source electrode 3 and the drain electrode 4, for example. In this state, an off-voltage (0 V) or an on-voltage (5 V) is applied to the gate electrode 22 while using the source electrode 3 as a reference potential (0 V).

FIGS. 4A through 4I are cross-sectional views for describing an example of a manufacturing method of the above-described nitride semiconductor apparatus 1 according to the first embodiment, and illustrate cross-sectional structures at plural stages in the manufacturing method. FIGS. 4A through 4I are cross-sectional views corresponding to the cross-section of FIG. 3.

Figure 4A:
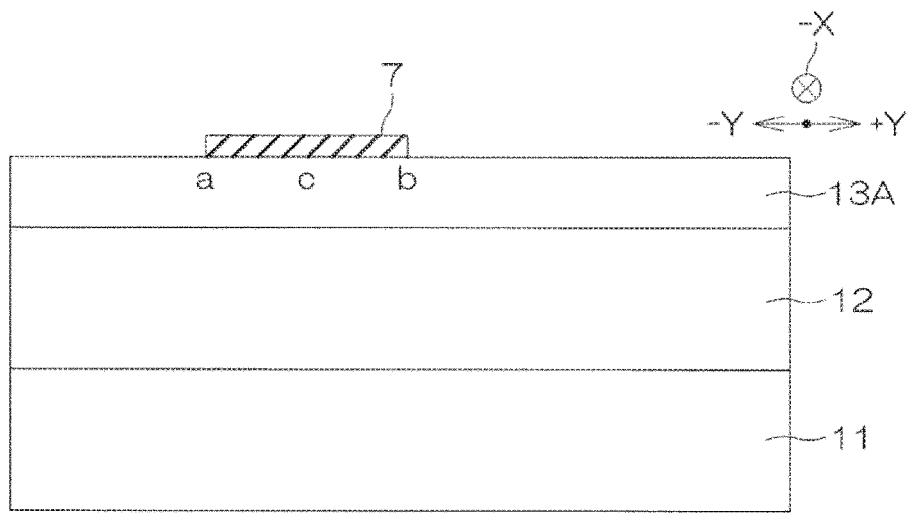
FIG. 4A is a cross-sectional view illustrating a step in a manufacturing method of the nitride semiconductor apparatus of FIG. 3, and corresponding to the cross-section of FIG. 3.

First, as illustrated in FIG. 4A, the buffer layer 12 and the lower layer 13A of the first nitride semiconductor layer 13 are epitaxially grown on the substrate 11 by a metal organic chemical vapor deposition (MOCVD) method. The insulator 7 of the strip shape when viewed in plan is then formed in a predetermined region on the lower layer 13A.

Figure 4B:
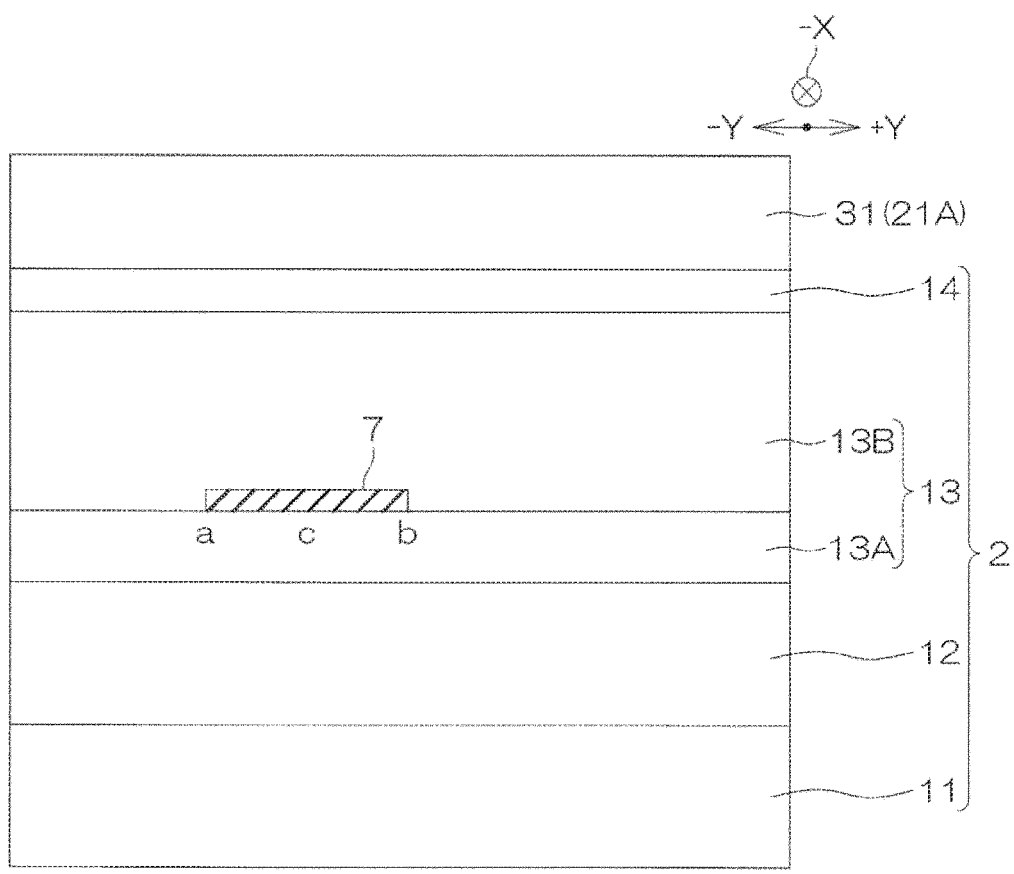
FIG. 4B is a cross-sectional view illustrating a step next to that of FIG. 4A.

Next, as illustrated in FIG. 4B, the upper layer 13B of the first nitride semiconductor layer 13 is epitaxially grown on the lower layer 13A of the first nitride semiconductor layer 13 to cover the insulator 7. Further, the second nitride semiconductor layer 14 is epitaxially grown on the upper layer 13B. As a consequence, the semiconductor stack structure 2 is obtained. Further, a gate layer material film 31, which is a material film for the semiconductor gate layer 21, is epitaxially grown on the second nitride semiconductor layer 14. In this embodiment, the gate layer material film 31 is a p-type GaN film.

Figure 4C:
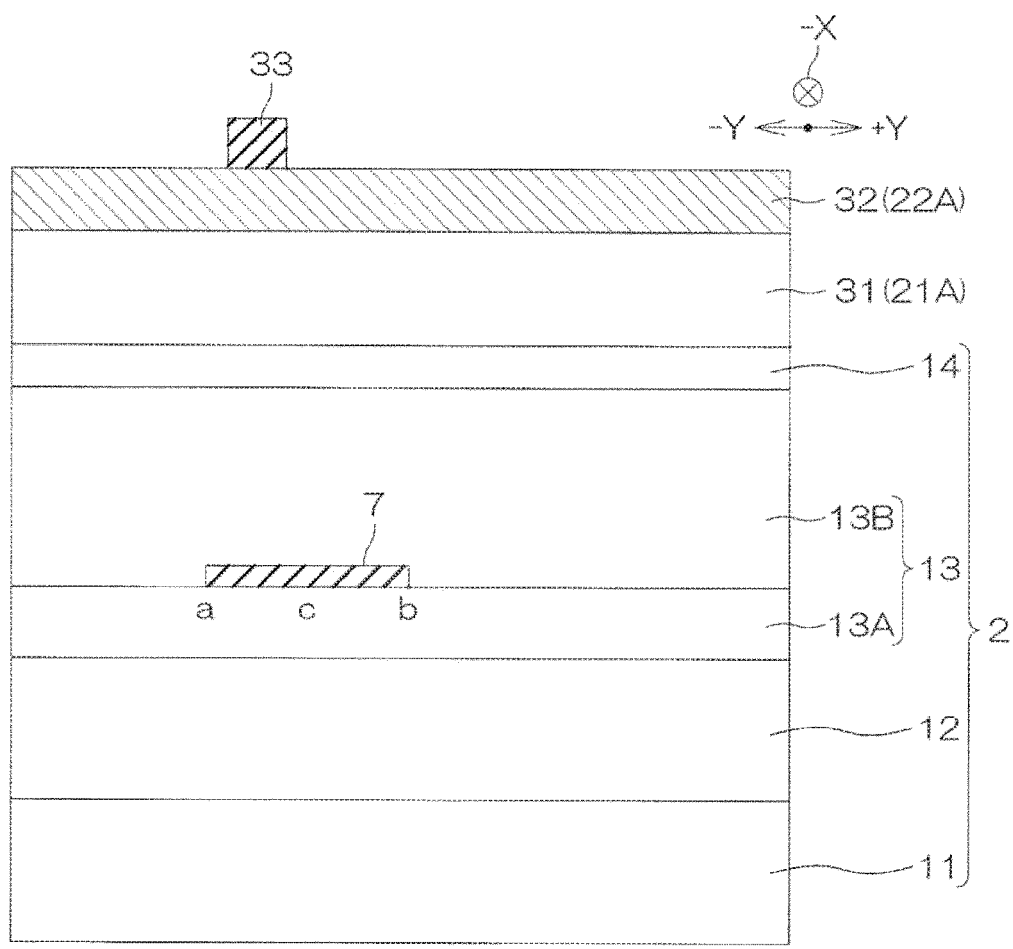
FIG. 4C is a cross-sectional view illustrating a step next to that of FIG. 4B.

Next, as illustrated in FIG. 4C, a gate electrode film 32, which is a material film for the gate electrode 22, is formed on the gate layer material film 31 by a sputtering method. The gate electrode film 32 is formed, for example, of a metal film of TiN. By photolithography, a SiN film (hereinafter called "first insulating film 33") is further formed covering a region, where the gate electrode is to be formed, on the surface of the gate electrode film 32.

Figure 4D:
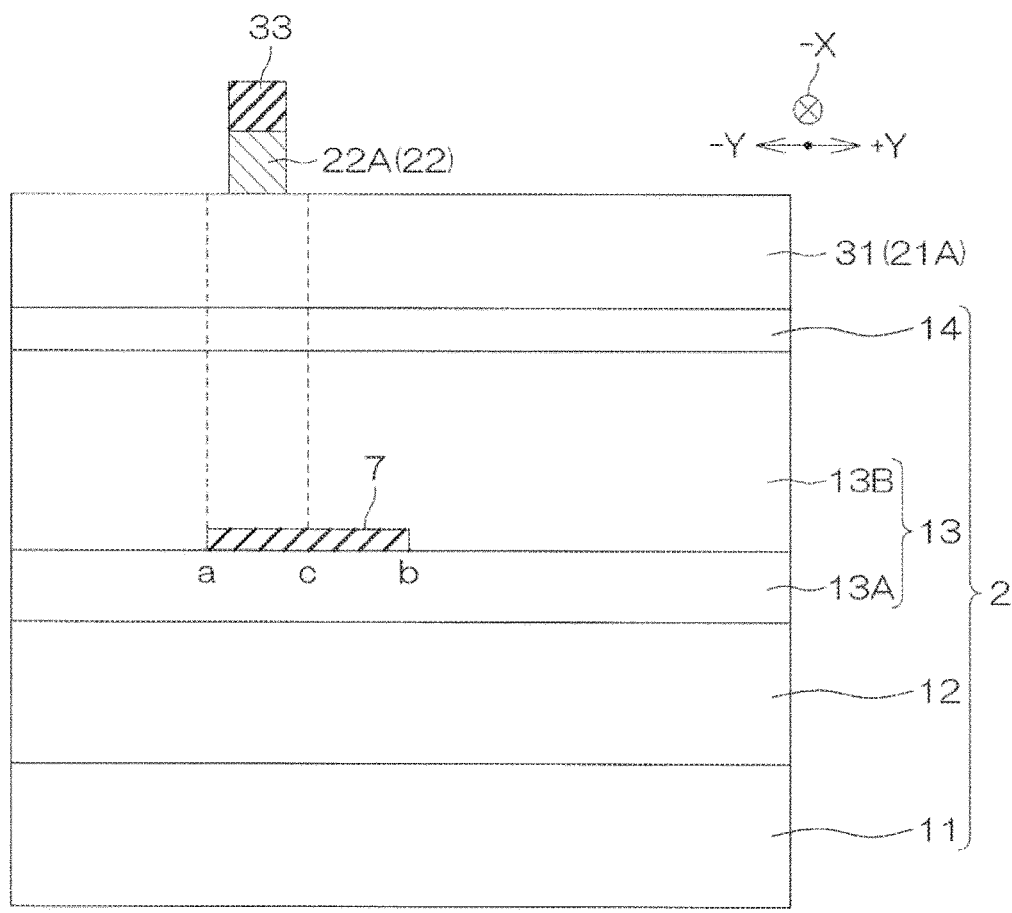
FIG. 4D is a cross-sectional view illustrating a step next to that of FIG. 4C.

Next, as illustrated in FIG. 4D, the gate electrode film 32 is selectively etched using the first insulating film 33 as a mask. As a consequence, the gate electrode film 32 is patterned to obtain the gate electrode 22.

Figure 4E:
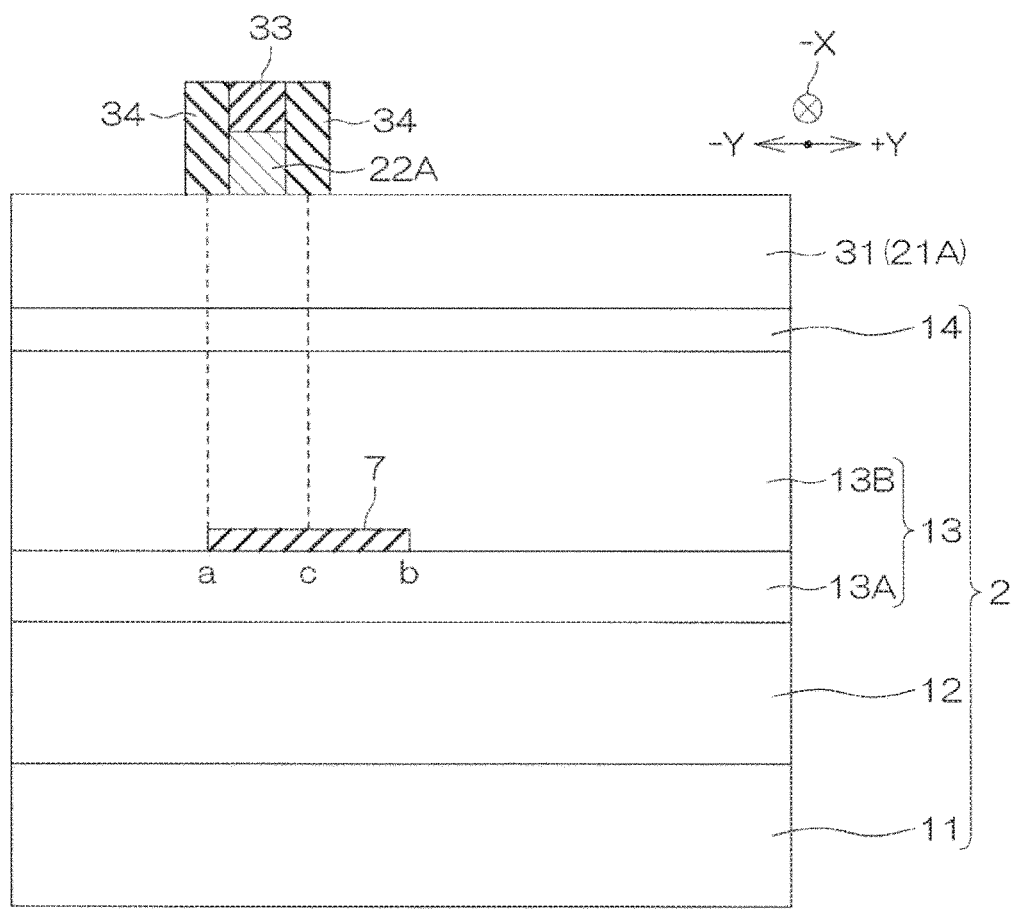
FIG. 4E is a cross-sectional view illustrating a step next to that of FIG. 4D.

Next, a SiN film (hereinafter called "second insulating film 34") is formed, for example, by a plasma chemical vapor deposition (PECVD) method to cover the exposed surfaces in their entirety. Then, as illustrated in FIG. 4E, the second insulating film 34 is etched back, for example, by dry etching, whereby the second insulating film 34 is formed covering the side surfaces of the gate electrode 22 and the first insulating film 33.

Figure 4F:
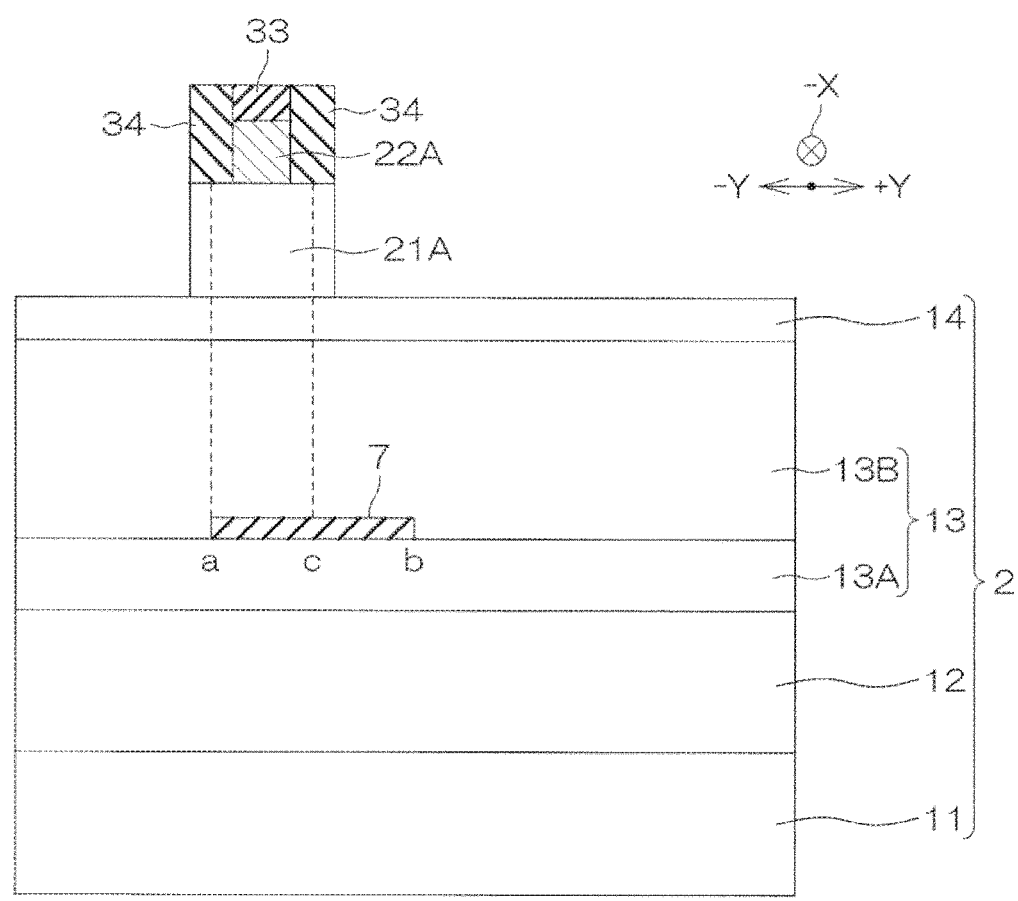
FIG. 4F is a cross-sectional view illustrating a step next to that of FIG. 4E.

Next, as illustrated in FIG. 4F, the gate layer material film 31 is patterned by conducting dry etching while using the first insulating film 33 and the second insulating film 34 as masks. As a consequence, the ridge-shaped semiconductor gate layer 21 is obtained.

Figure 4G:
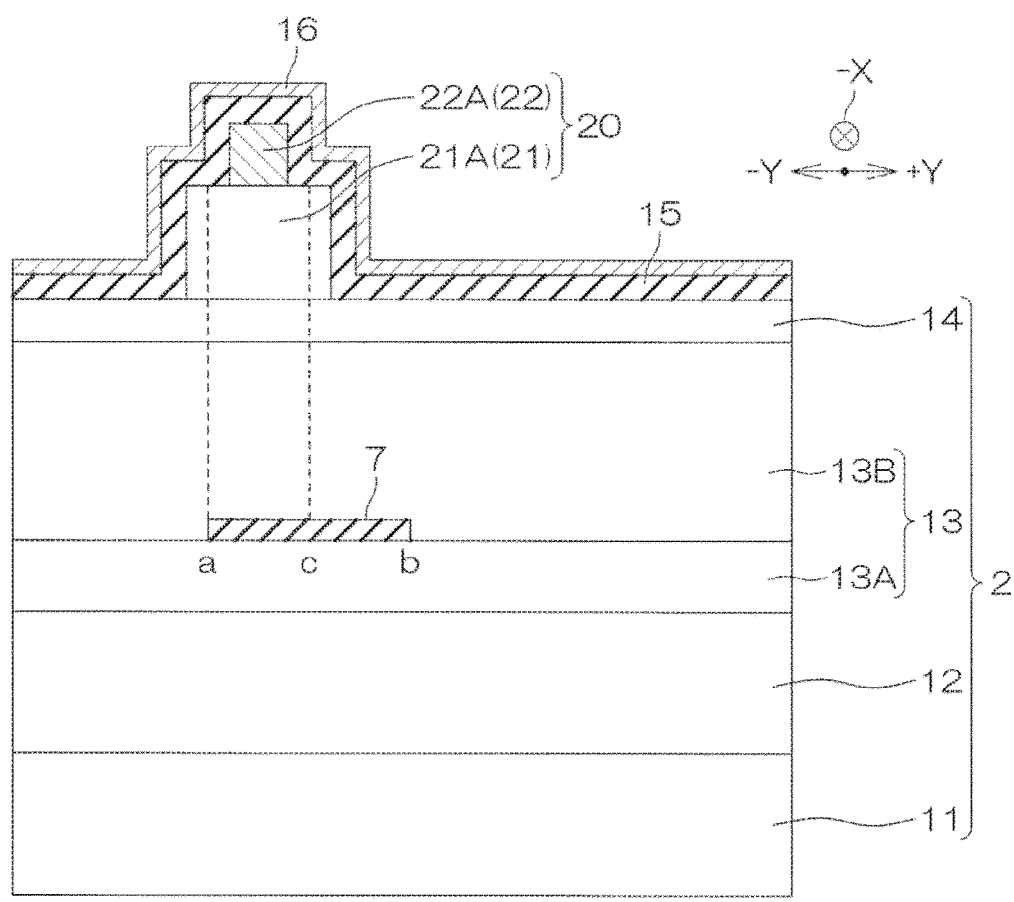
FIG. 4G is a cross-sectional view illustrating a step next to that of FIG. 4F.

Next, as illustrated in FIG. 4G, the first insulating film 33 and the second insulating film 34 are removed by wet etching. As a consequence, the gate portion 20, which is formed of the ridge-shaped semiconductor gate layer 21 and the gate electrode 22 formed on the widthwise intermediate area on the upper surface of the semiconductor gate layer 21, is obtained.

Next, the passivation film 15 is formed to cover the exposed surfaces in their entirety. The passivation film 15 is formed, for example, from SiN. Further, the barrier metal film 16 is formed on the passivation film 15. The barrier metal film 16 is formed, for example, from TiN.

Figure 4H:
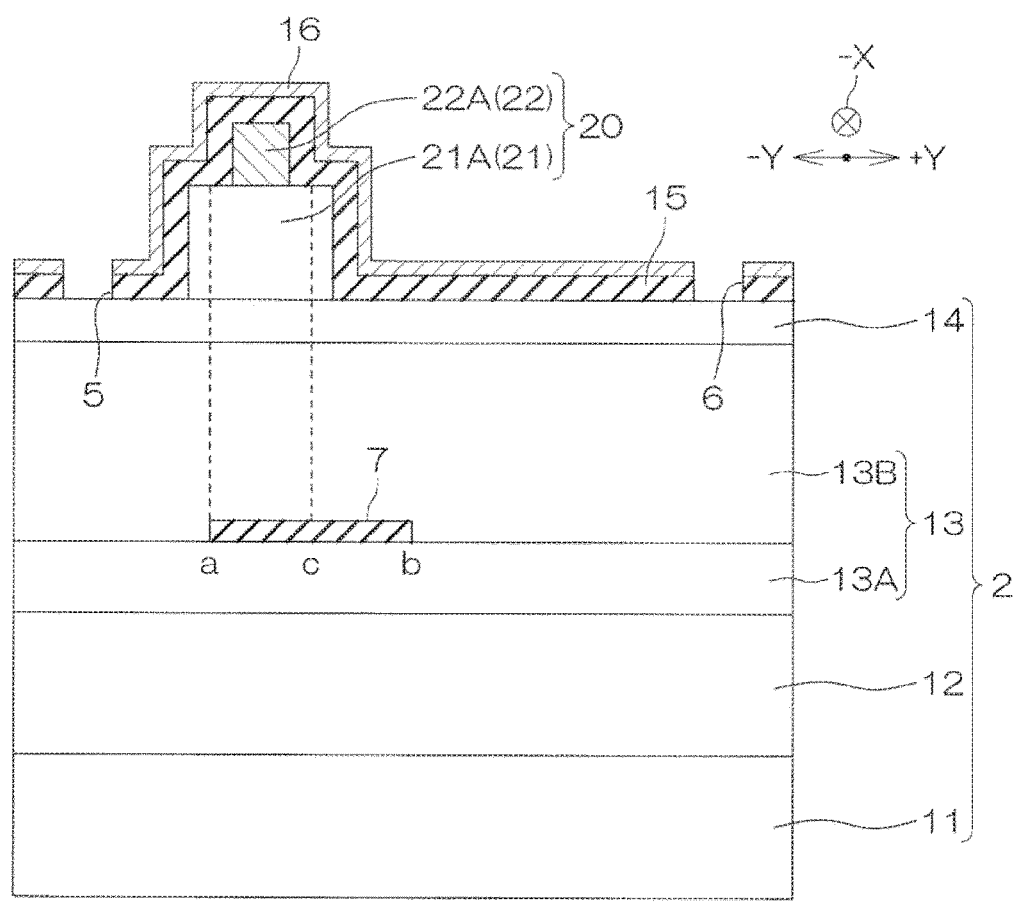
FIG. 4H is a cross-sectional view illustrating a step next to that of FIG. 4G.

Next, as illustrated in FIG. 4H, through the barrier metal film 16 and the passivation film 15, the source contact hole 5 and the drain contact hole 6 are formed extending to the second nitride semiconductor layer 14.

Figure 4I:
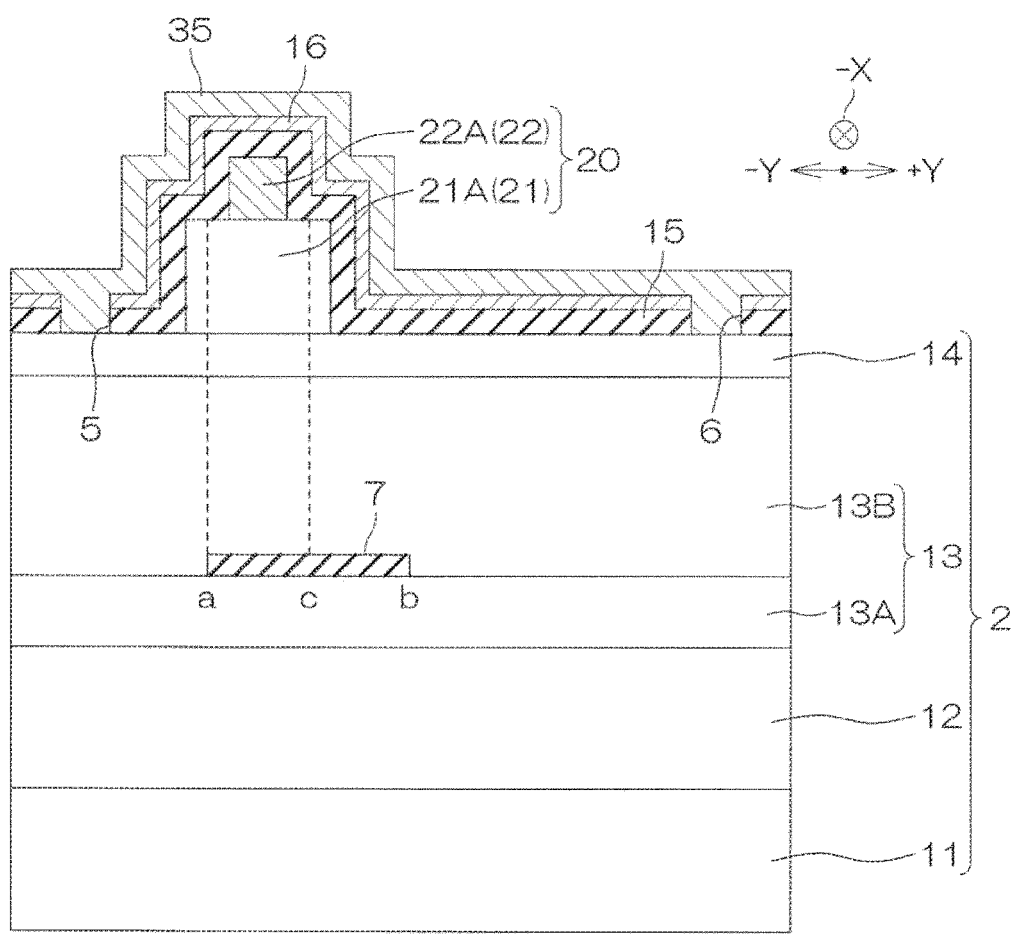
FIG. 4I is a cross-sectional view illustrating a step next to that of FIG. 4H.

Next, as illustrated in FIG. 4I, a source/drain electrode film 35 is formed to cover the exposed surfaces in their entirety.

Finally, the source electrode 3 and the drain electrode 4 are formed in contact with the second nitride semiconductor layer 14 through patterning of the source/drain electrode film 35 and the barrier metal film 16 by photolithography and etching. As a consequence, the nitride semiconductor apparatus 1 is obtained with such a structure as illustrated in FIGS. 1 and 3.

Figure 5:
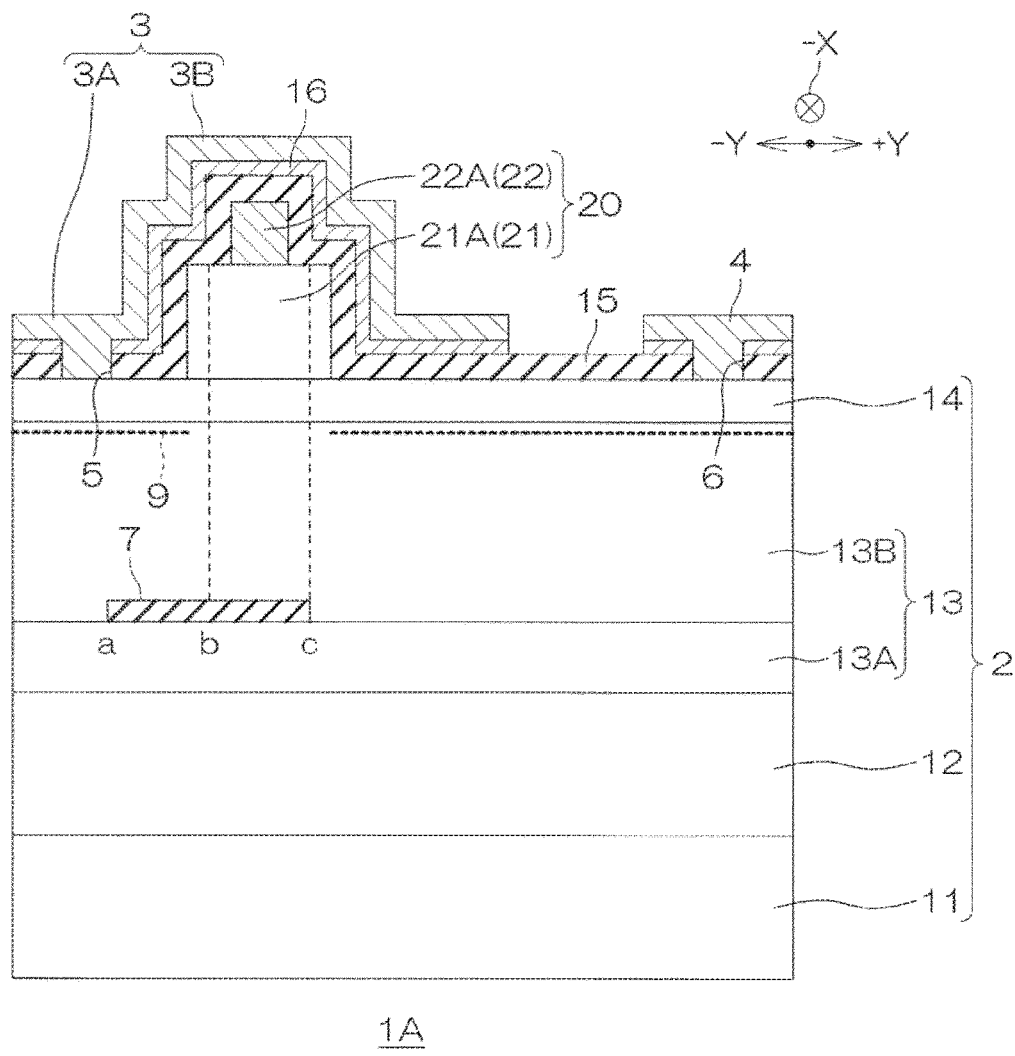
FIG. 5 is a cross-sectional view illustrating a nitride semiconductor apparatus according to a first modification that is different from the first embodiment in the relative positional relation between the main gate electrode portion and the insulator.

FIG. 5 is a cross-sectional view illustrating a nitride semiconductor apparatus 1A according to a first modification that is different from the first embodiment in the relative positional relation between the main gate electrode portion 22A (ridge portion 21A) and the insulator 7. In FIG. 5, parts corresponding to individual parts in FIG. 3 described above are identified by like signs.

In the nitride semiconductor apparatus 1A according to the first modification, when viewed in plan, the widthwise center c and the second side edge b of the insulator 7 exist inside both the opposite side edges of the ridge portion 21A, but the first side edge a of the insulator 7 exists on an outer side than the side edge of the ridge portion 21A, the side edge corresponding to the first side edge a.

When viewed in plan, the distance between the side edge b of the insulator 7, the side edge b being on the side of the drain electrode 4, and the widthwise center of the ridge portion 21A is smaller than the distance between the side edge a of the insulator 7, the side edge a being on the side of the source electrode 3, and the widthwise center of the ridge portion 21A.

In this nitride semiconductor apparatus 1A, the bottom surface of the main gate electrode portion 22A is disposed right above an intermediate region between the widthwise center c and the second side edge b of the insulator 7. In other words, when viewed in plan, the side edge of the main gate electrode portion 22A, the side edge corresponding to the second side edge b of the insulator 7, is disposed inside the second side edge b, and the side edge of the main gate electrode portion 22A, the side edge corresponding to the first side edge a of the insulator 7, is disposed inside the widthwise center c of the insulator 7 (on the side of the second side edge b).

Therefore, the bottom surface of the main gate electrode portion 22A does not exist right above any of the first side edge a, widthwise center c and second side edge b of the insulator 7. As a consequence, the bottom surface of the main gate electrode portion 22A is disposed in a region other than the positions right above crystal defects in the ridge portion 21A, thereby allowing to increase the gate rated voltage.

FIGS. 6, 7, 8, 9, 10 and 11 are cross-sectional views illustrating nitride semiconductor apparatuses 1B,1C,1D,1E, 1F,1G according to second, third, fourth, fifth, sixth and seventh modifications different from each another in the relative positional relation between the main gate electrode portion 22A (ridge portion 21A) and the insulator 7. In FIGS. 7 through 11, parts corresponding to individual parts of FIG. 3 described above are identified by like signs.

Figure 6:
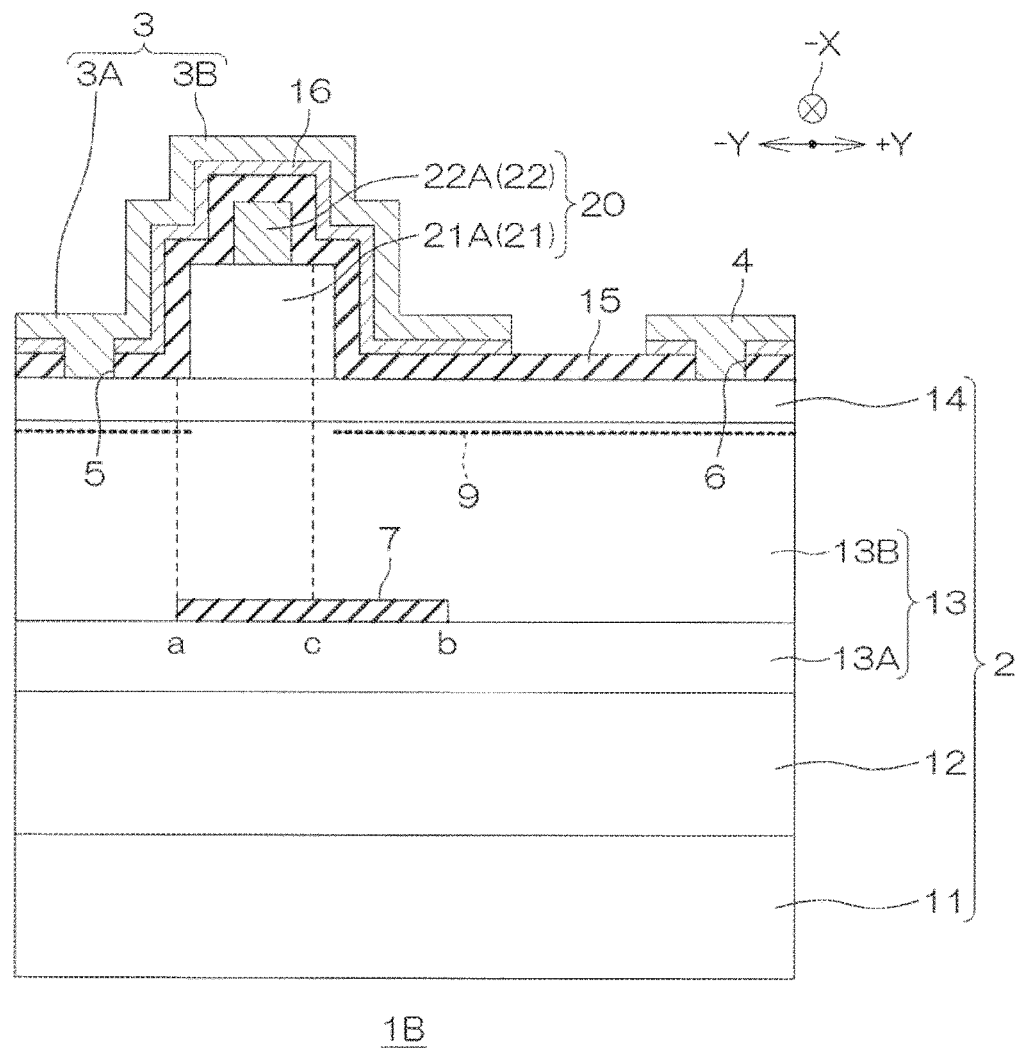
FIG. 6 is a cross-sectional view illustrating a nitride semiconductor apparatus according to a second modification that is different from the first embodiment in the width of the insulator and in the relative positional relation between the main gate electrode portion and the insulator.

In the nitride semiconductor apparatus 1B according to the second modification as illustrated in FIG. 6, the insulator 7 has a width greater than the insulator 7 of the nitride semiconductor apparatus 1 of FIG. 1 (see FIG. 3).

In this nitride semiconductor apparatus 1B, when viewed in plan, the widthwise center c of the insulator 7 exists inside both the opposite side edges of the ridge portion 21A, but the first side edge a of the insulator 7 exists on an outer side than the side edge of the ridge portion 21A, the side edge corresponding to the first side edge a, and the second side edge b of the insulator 7 exists on an outer side than the side edge of the ridge portion 21A, the side edge corresponding to the second side edge b.

When viewed in plan, the distance between the side edge b of the insulator 7, the side edge b being on the side of the drain electrode 4, and the widthwise center of the ridge portion 21A is greater than the distance between the side edge a of the insulator 7, the side edge a being on the side of the source electrode 3, and the widthwise center of the ridge portion 21A.

In this nitride semiconductor apparatus 1B, the bottom surface of the main gate electrode portion 22A is disposed right above an intermediate region between the first side edge a and the widthwise center c of the insulator 7. In other words, when viewed in plan, the side edge of the main gate electrode portion 22A, the side edge corresponding to the first side edge a of the insulator 7, is disposed inside the first side edge a, and the side edge of the main gate electrode portion 22A, the side edge corresponding to the second side edge b of the insulator 7, is disposed inside the widthwise center c of the insulator 7 (on the side of the first side edge a).

Therefore, the bottom surface of the main gate electrode portion 22A does not exist right above any of the first side edge a, widthwise center c and second side edge b of the insulator 7. As a consequence, the bottom surface of the main gate electrode portion 22A is disposed in a region other than the positions right above crystal defects in the ridge portion 21A, thereby allowing to increase the gate rated voltage.

Figure 7:
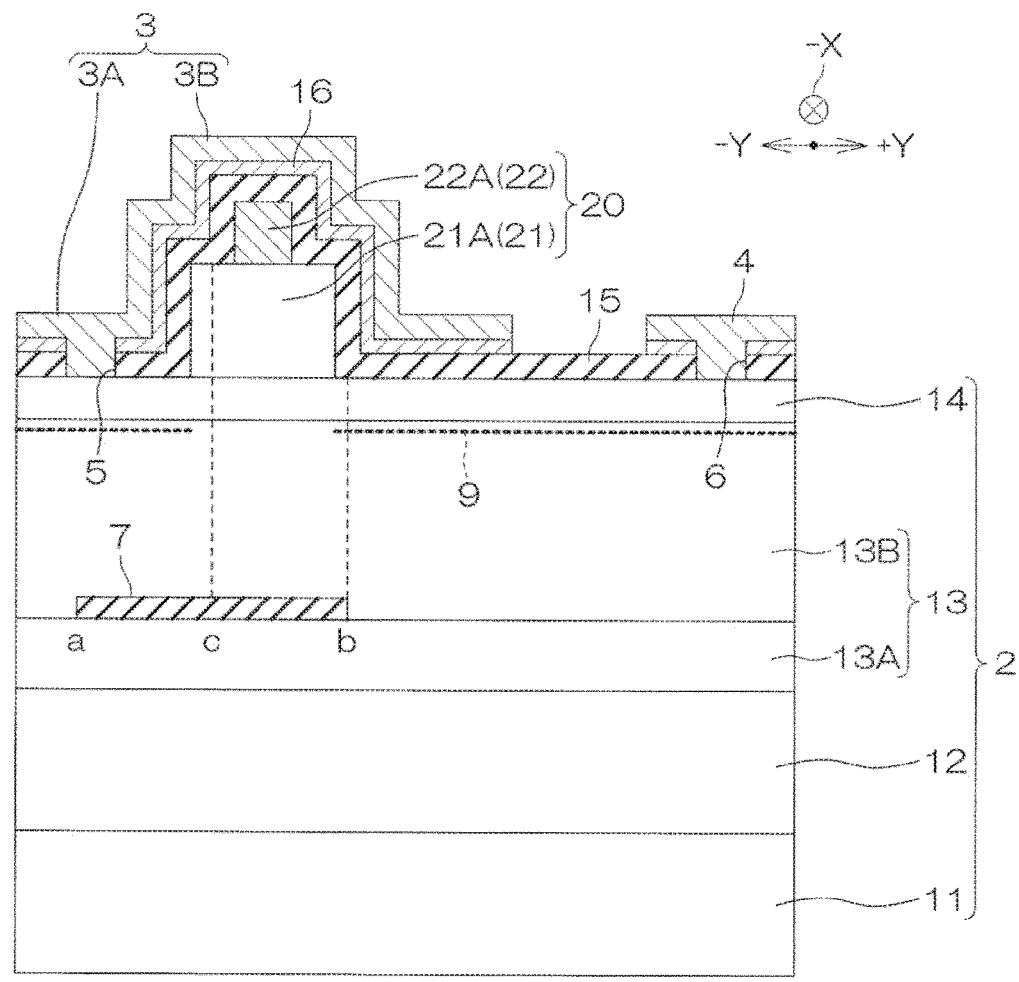
FIG. 7 is a cross-sectional view illustrating a nitride semiconductor apparatus according to a third modification that is different from the first embodiment in the width of the insulator and in the relative positional relation between the main gate electrode portion and the insulator.

In the nitride semiconductor apparatus 1C according to the third modification as illustrated in FIG. 7, the insulator 7 has a width greater than the insulator 7 of the nitride semiconductor apparatus 1 of FIG. 1.

In this nitride semiconductor apparatus 1C, when viewed in plan, the widthwise center c of the insulator 7 exists inside both the opposite side edges of the ridge portion 21A, but the first side edge a of the insulator 7 exists on an outer side than the side edge of the ridge portion 21A, the side edge corresponding to the first side edge a, and the second side edge b of the insulator 7 exists on an outer side than the side edge of the ridge portion 21A, the side edge corresponding to the second side edge b.

When viewed in plan, the distance between the side edge b out of both the opposite side edges of the insulator 7, the side edge b being on the side of the drain electrode 4, and the widthwise center of the ridge portion 21A is smaller than the distance between the side edge a out of both the opposite side edges of the insulator 7, the side edge a being on the side of the source electrode 3, and the widthwise center of the ridge portion 21A.

In this nitride semiconductor apparatus 1C, the bottom surface of the main gate electrode portion 22A is disposed right above an intermediate region between the widthwise center c and the second side edge b of the insulator 7. In other words, when viewed in plan, the side edge of the main gate electrode portion 22A, the side edge corresponding to the first side edge a of the insulator 7, is disposed inside the widthwise center c of the insulator 7 (on the side of the second side edge b), and the side edge of the main gate electrode portion 22A, the side edge corresponding to the second side edge b of the insulator 7, is disposed inside the second side edge b of the insulator 7.

Therefore, the bottom surface of the main gate electrode portion 22A does not exist right above any of the first side edge a, widthwise center c and second side edge b of the insulator 7. As a consequence, the bottom surface of the main gate electrode portion 22A is disposed in a region other than the positions right above crystal defects in the ridge portion 21A, thereby allowing to increase the gate rated voltage.

Figure 8:
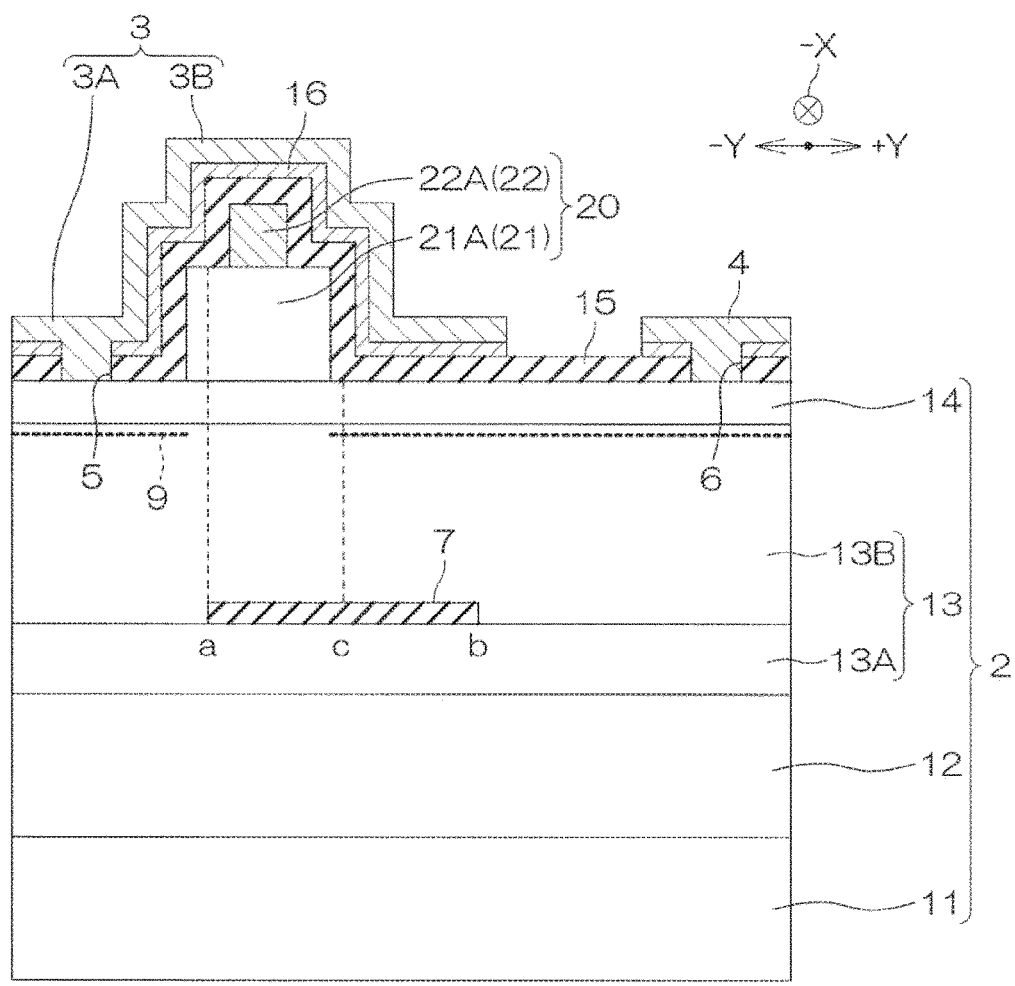
FIG. 8 is a cross-sectional view illustrating a nitride semiconductor apparatus according to a fourth modification that is different from the first embodiment in the width of the insulator and in the relative positional relation between the main gate electrode portion and the insulator.

In the nitride semiconductor apparatus 1D according to the fourth modification as illustrated in FIG. 8, the insulator 7 has a width greater than the insulator 7 of the nitride semiconductor apparatus 1 of FIG. 1.

In this nitride semiconductor apparatus 1D, when viewed in plan, the first side edge a of the insulator 7 exists inside both the opposite side edges of the ridge portion 21A, but the widthwise center c and the second side edge b of the insulator 7 exist on an outer side than the side edge of the ridge portion 21A, the side edge corresponding to the second side edge b.

When viewed in plan, the distance between the side edge b of the insulator 7, the side edge b being on the side of the drain electrode 4, and the widthwise center of the ridge portion 21A is greater than the distance between the side edge a of the insulator 7, the side edge a being on the side of the source electrode 3, and the widthwise center of the ridge portion 21A.

In this nitride semiconductor apparatus 1D, the bottom surface of the main gate electrode portion 22A is disposed right above an intermediate region between the first side edge a and the widthwise center c of the insulator 7. In other words, when viewed in plan, the side edge of the main gate electrode portion 22A, the side edge corresponding to the first side edge a of the insulator 7, is disposed inside the first side edge a, and the side edge of the main gate electrode portion 22A, the side edge corresponding to the second side edge b of the insulator 7, is disposed inside the widthwise center c of the insulator 7 (on the side of the first side edge a).

Therefore, the bottom surface of the main gate electrode portion 22A does not exist right above any of the first side edge a, widthwise center c and second side edge b of the insulator 7. As a consequence, the bottom surface of the main gate electrode portion 22A is disposed in a region other than the positions right above crystal defects in the ridge portion 21A, thereby allowing to increase the gate rated voltage.

Figure 9:
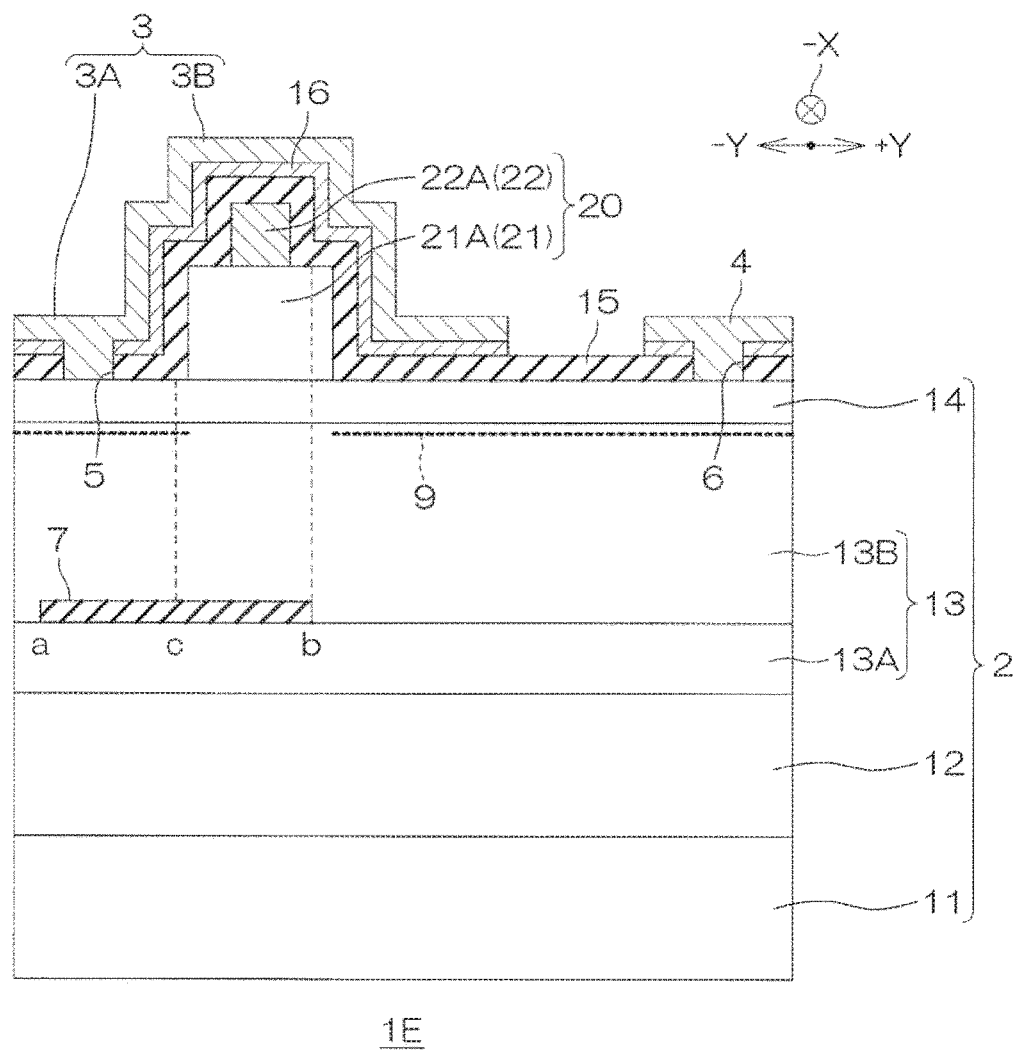
FIG. 9 is a cross-sectional view illustrating a nitride semiconductor apparatus according to a fifth modification that is different from the first embodiment in the width of the insulator and in the relative positional relation between the main gate electrode portion and the insulator.

In the nitride semiconductor apparatus 1E according to the fifth modification as illustrated in FIG. 9, the insulator 7 has a width greater than the insulator 7 of the nitride semiconductor apparatus 1 of FIG. 1.

In this nitride semiconductor apparatus 1E, when viewed in plan, the second side edge b of the insulator 7 exists inside both the opposite side edges of the ridge portion 21A, but the first side edge a and the widthwise center c of the insulator 7 exist on an outer side than the side edge of the ridge portion 21A, the side edge corresponding to the first side edge a.

When viewed in plan, the distance between the side edge b of the insulator 7, the side edge b being on the side of the drain electrode 4, and the widthwise center of the ridge portion 21A is smaller than the distance between the side edge a of the insulator 7, the side edge a being on the side of the source electrode 3, and the widthwise center of the ridge portion 21A.

In this nitride semiconductor apparatus 1E, the bottom surface of the main gate electrode portion 22A is disposed right above an intermediate region between the widthwise center c and the second side edge b of the insulator 7. In other words, when viewed in plan, the side edge of the main gate electrode portion 22A, the side edge corresponding to the first side edge a of the insulator 7, is disposed inside the widthwise center c of the insulator 7 (on the side of the second side edge b), and the side edge of the main gate electrode portion 22A, the side edge corresponding to the second side edge b of the insulator 7, is disposed inside the second side edge b of the insulator 7.

Therefore, the bottom surface of the main gate electrode portion 22A does not exist right above any of the first side edge a, widthwise center c and second side edge b of the insulator 7. As a consequence, the bottom surface of the main gate electrode portion 22A is disposed in a region other than the positions right above crystal defects in the ridge portion 21A, thereby allowing to increase the gate rated voltage.

Figure 10:
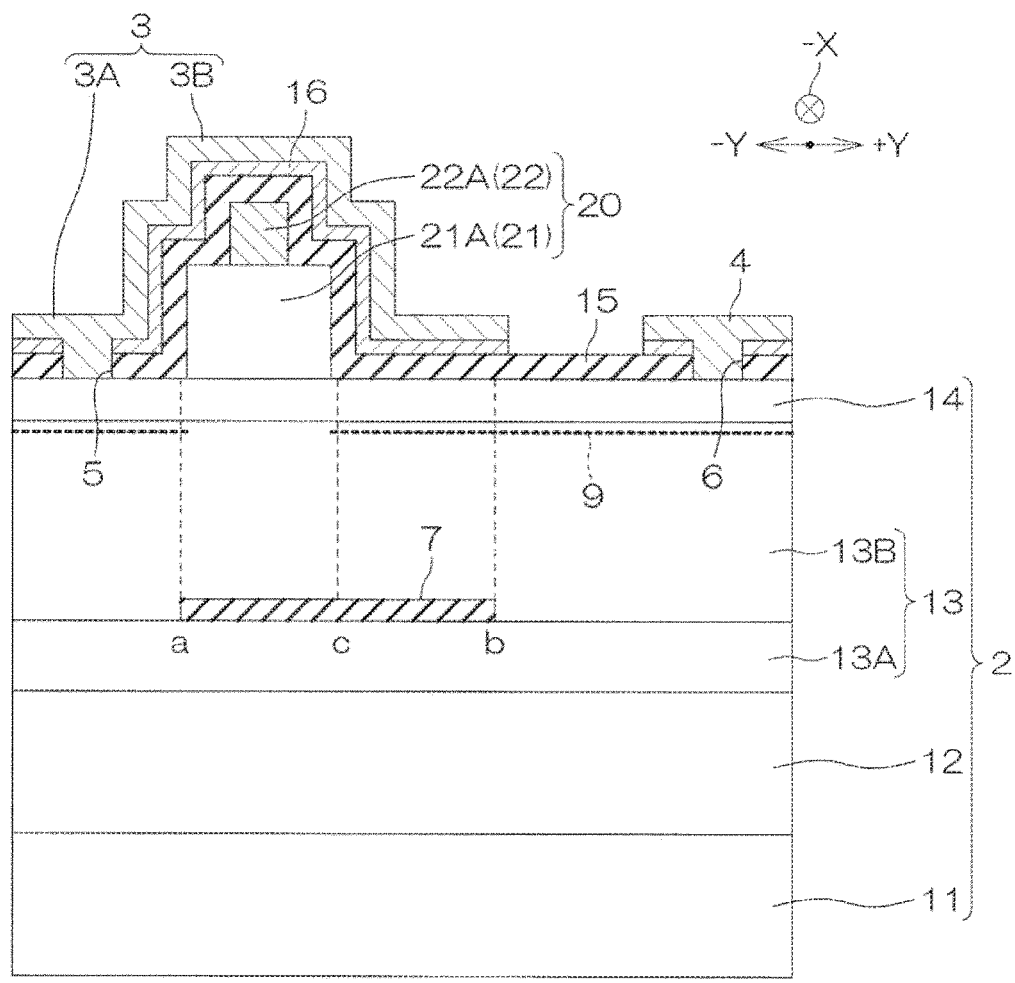
FIG. 10 is a cross-sectional view illustrating a nitride semiconductor apparatus according to a sixth modification that is different from the first embodiment in the width of the insulator and in the relative positional relation between the main gate electrode portion and the insulator.

In the nitride semiconductor apparatus 1F according to the sixth modification as illustrated in FIG. 10, the insulator 7 has a width greater than the insulator 7 of the nitride semiconductor apparatus 1 of FIG. 1.

In this nitride semiconductor apparatus 1F, the bottom surface of the ridge portion 21A is disposed right above an intermediate region between the first side edge a and the widthwise center c of the insulator 7. In other words, when viewed in plan, the side edge of the ridge portion 21A, the side edge corresponding to the first side edge a of the insulator 7, is disposed inside the first side edge a, and the side edge of the ridge portion 21A, the side edge corresponding to the second side edge b of the insulator 7, is disposed inside the widthwise center c of the insulator 7 (on the side of the first side edge a).

Therefore, the bottom surface of the ridge portion 21A does not exist right above any of the first side edge a, widthwise center c and second side edge b of the insulator 7. As a consequence, crystal defects hardly appear in the ridge portion 21A, and hence the metal material that includes the main gate electrode portion 22A can be suppressed from diffusing into the ridge portion 21A, thereby allowing to increase the gate rated voltage further.

When viewed in plan, the distance between the side edge b of the insulator 7, the side edge b being on the side of the drain electrode 4, and the widthwise center of the ridge portion 21A is greater than the distance between the side edge a of the insulator 7, the side edge a being on the side of the source electrode 3, and the widthwise center of the ridge portion 21A.

In this nitride semiconductor apparatus 1F, the bottom surface of the main gate electrode portion 22A is disposed right above an intermediate region between the first side edge a and the widthwise center c of the insulator 7. In other words, when viewed in plan, the side edge of the main gate electrode portion 22A, the side edge corresponding to the first side edge a of the insulator 7, is disposed inside the first side edge a, and the side edge of the main gate electrode portion 22A, the side edge corresponding to the second side edge b of the insulator 7, is disposed inside the widthwise center c of the insulator 7 (on the side of the first side edge a). Therefore, the bottom surface of the main gate electrode portion 22A does not exist right above any of the first side edge a, widthwise center c and second side edge b of the insulator 7.

Figure 11:
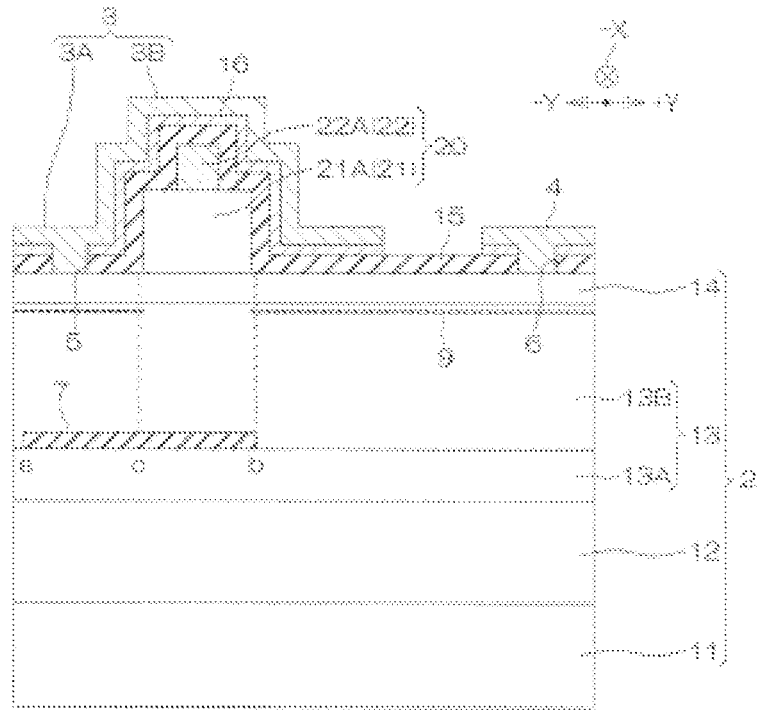
FIG. 11 is a cross-sectional view illustrating a nitride semiconductor apparatus according to a seventh modification that is different from the first embodiment in the width of the insulator and in the relative positional relation between the main gate electrode portion and the insulator.

In the nitride semiconductor apparatus 1G according to the seventh modification as illustrated in FIG. 11, the insulator 7 has a width greater than the insulator 7 of the nitride semiconductor apparatus 1 of FIG. 1.

In this nitride semiconductor apparatus 1G, the bottom surface of the ridge portion 21A is disposed right above an intermediate region between the widthwise center c and the second side edge b of the insulator 7. In other words, when viewed in plan, the side edge of the ridge portion 21A, the side edge corresponding to the first side edge a of the insulator 7, is disposed inside the widthwise center c of the insulator 7 (on the side of the second side edge b), and the side edge of the ridge portion 21A, the side edge corresponding to the second side edge b of the insulator 7, is disposed inside the second side edge b of the insulator 7.

Therefore, the bottom surface of the ridge portion 21A does not exist right above any of the first side edge a, widthwise center c and second side edge b of the insulator 7. As a consequence, crystal defects hardly appear in the ridge portion 21A, and hence the metal material that includes the main gate electrode portion 22A can be suppressed from diffusing into the ridge portion 21A, thereby allowing to increase the gate rated voltage further.

When viewed in plan, the distance between the side edge b of the insulator 7, the side edge b being on the side of the drain electrode 4, and the widthwise center of the ridge portion 21A is smaller than the distance between the side edge a of the insulator 7, the side edge a being on the side of the source electrode 3, and the widthwise center of the ridge portion 21A.

In this nitride semiconductor apparatus 1G, the bottom surface of the main gate electrode portion 22A is disposed right above an intermediate region between the widthwise center c and the second side edge b of the insulator 7. In other words, when viewed in plan, the side edge of the main gate electrode portion 22A, the side edge corresponding to the first side edge a of the insulator 7, is disposed inside the widthwise center c of the insulator 7 (on the side of the second side edge b), and the side edge of the main gate electrode portion 22A, the side edge corresponding to the second side edge b of the insulator 7, is disposed inside the second side edge b of the insulator 7. Therefore, the bottom surface of the main gate electrode portion 22A does not exist right above any of the first side edge a, widthwise center c and second side edge b of the insulator 7.

Figure 12:
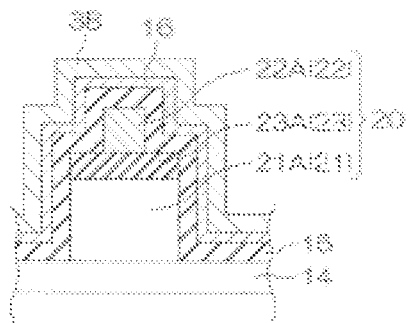
FIG. 12 is a fragmentary cross-sectional view illustrating a modification of a gate portion.

FIG. 12 is a fragmentary cross-sectional view illustrating a modification of the gate portion.

One of the semiconductor gate layers 21 in the nitride semiconductor apparatuses 1, 1A through 1G illustrated in FIG. 3 and FIGS. 5 through 11 is assumed to be the first semiconductor gate layer 21. On the first semiconductor gate layer 21, a second semiconductor gate layer (second nitride semiconductor gate layer) 23 is stacked. The second semiconductor gate layer 23 has a ridge portion 23A formed on the ridge portion 21A and a connecting portion (not illustrated) formed on a connecting portion 21B.

The second semiconductor gate layer 23 is formed from a nitride semiconductor having a greater band gap than the first semiconductor gate layer 21. The second semiconductor gate layer 23 is formed, for example, from $Al_{x2}Ga_{1-x2}N$ ($0 \leq x2 < 1$).

The gate portion 20 is formed from the ridge portion 21A of the first semiconductor gate layer 21, the ridge portion 23A of the second semiconductor gate layer 23, the ridge portion 23A being formed on the ridge portion 21A, and the main gate electrode portion 22A formed on the ridge portion 23A.

The main gate electrode portion 22A is in Schottky contact with the surface of the second semiconductor gate layer 23. This configuration can reduce a leakage current because the injection of holes from the gate electrode 22 into the first semiconductor gate layer 21 can be suppressed by the second semiconductor gate layer 23.

Figure 13:
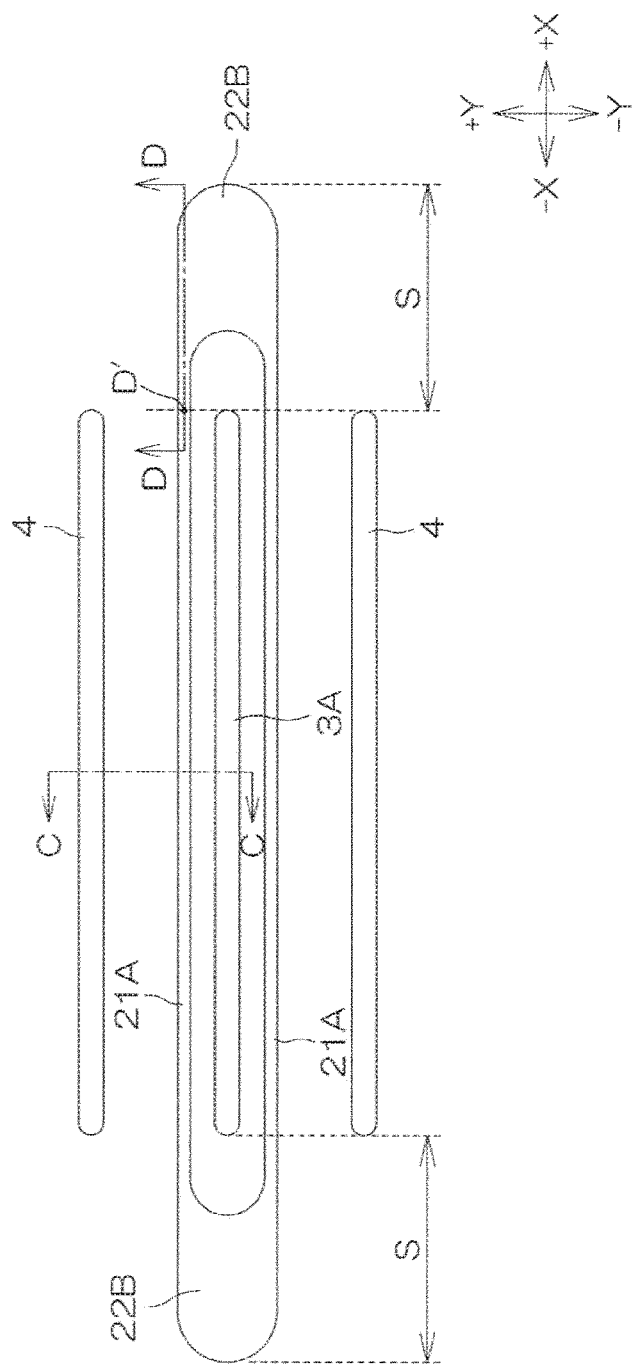
FIG. 13 is a partial plan view for describing the configuration of a nitride semiconductor apparatus according to a second embodiment of the present disclosure.
Figure 14:
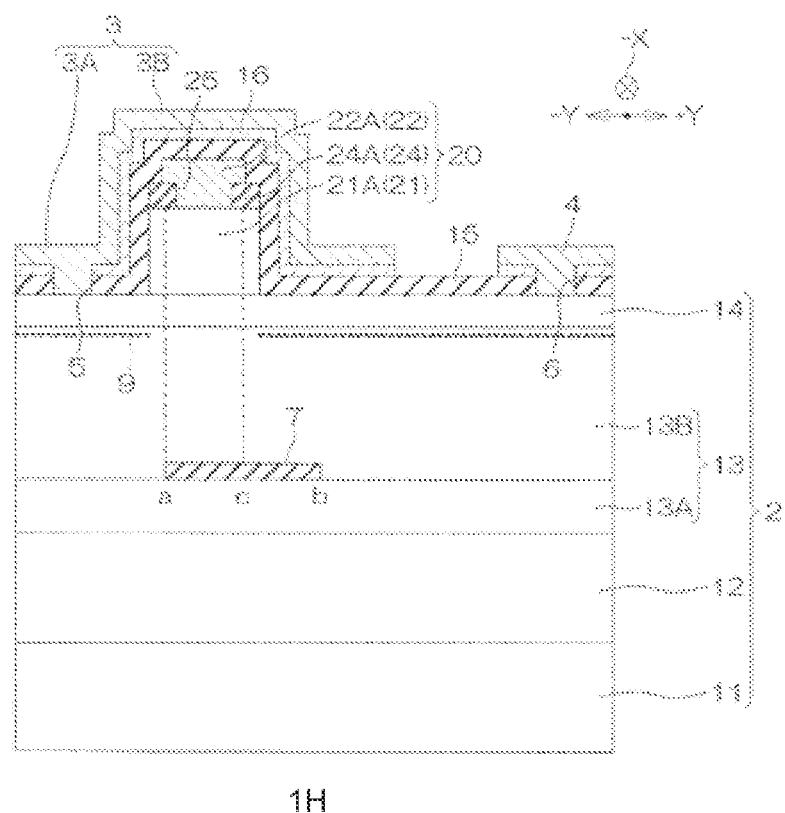
FIG. 14 is a cross-sectional view taken along line C-C of FIG. 13.
Figure 15:
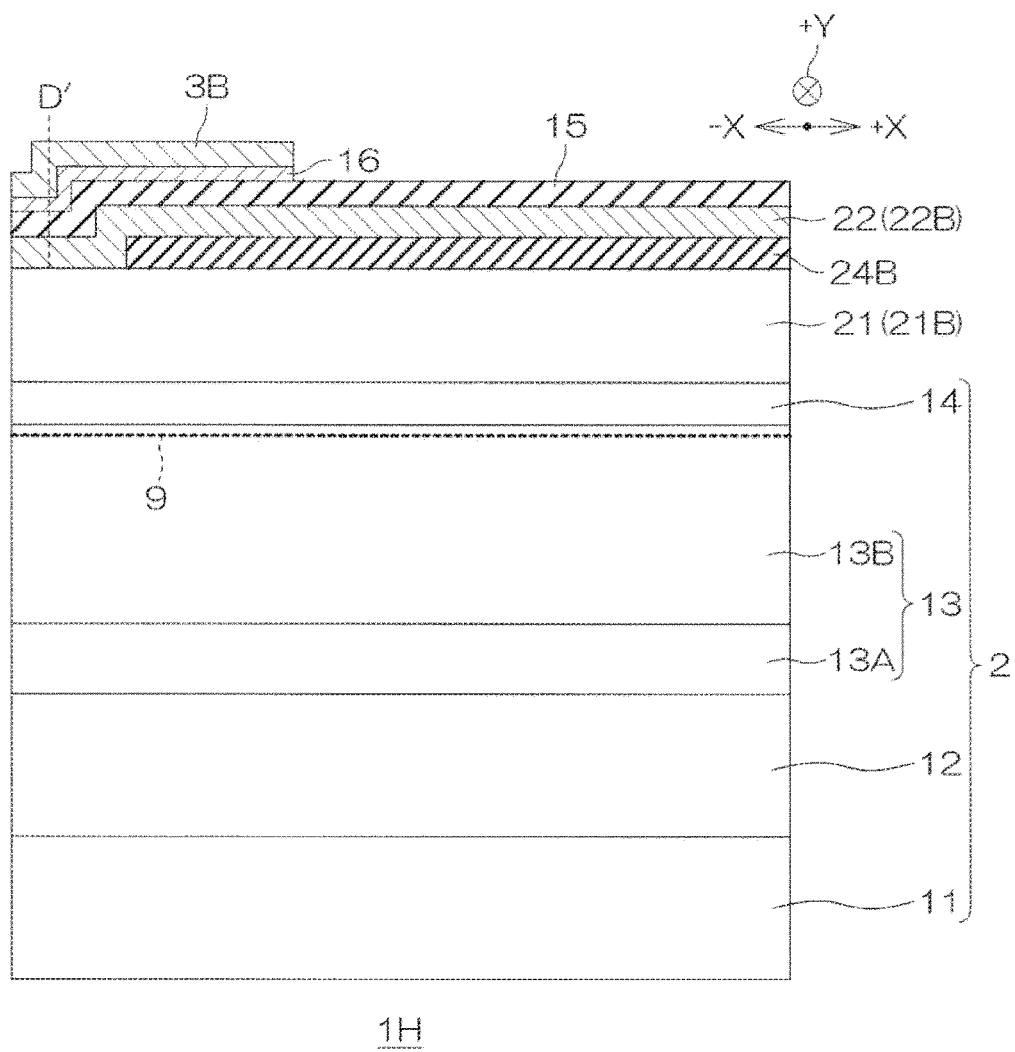
FIG. 15 is a cross-sectional view taken along line D-D of FIG. 13.

FIG. 13 is a partial plan view for describing the configuration of a nitride semiconductor apparatus according to a second embodiment, and is a plan view corresponding to FIG. 2A. FIG. 14 is a cross-sectional view taken along line C-C of FIG. 13. FIG. 15 is a cross-sectional view taken along line D-D of FIG. 13.

In FIG. 13, parts corresponding to individual parts in FIGS. 1 and 2 described above are identified by like signs. Further, in FIGS. 14 and 15, parts corresponding to individual parts in FIG. 3 are identified by like signs.

A more specific partial plan view of the nitride semiconductor apparatus 1H according to the second embodiment is substantially similar to the partial plan view of FIG. 1. The source electrode 3 is formed of the main source electrode portion 3A and the spread-out portion 3B as illustrated in FIG. 1. In FIG. 13, however, as the source electrode 3, only the main source electrode portion 3A is presented, and the spread-out portion 3B is omitted. Further, the widths of the ridge portions 21A of the semiconductor gate layer 21 are illustrated to be equal to those of the main gate electrode portions 22A of the gate electrode 22 in FIG. 13, although the widths of the ridge portions 21A are greater than those of the main gate electrode portions 22A.

Compared with the nitride semiconductor apparatus 1 according to the first embodiment, the nitride semiconductor apparatus 1H according to the second embodiment is different in that insulating layers 24A and 24B are selectively formed on the surface of the semiconductor gate layer 21. The insulating layers 24A and 24B are formed from SiN in this embodiment. The insulating layers 24A and 24B may also be formed from $SiO_2$, SiON, $Al_2O_3$, AlN, AlON, or the like.

Described specifically, on the ridge portion 21A, the insulating layers 24A are formed in a pair at opposite side areas on the surface of the ridge portion 21A as illustrated in FIG. 14. A space portion between the paired insulating layers 24A will be referred to as "opening 25."

The main gate electrode portion 22A is formed on the surface of the ridge portion 21A and the surfaces of the paired insulating layers 24A to cover the opening 25. Described specifically, the main gate electrode portion 22A includes a first portion embedded in the opening 25, and a second portion formed on the first portion and a peripheral edge area of the opening 25 on the surfaces of the paired insulating layers 24. In the nitride semiconductor apparatus 1H according to the second embodiment, a gate portion 20A is therefore formed of the ridge portion 21A, the insulating layers 24A and the main gate electrode portion 22A.

In the second embodiment, the bottom surface of the main gate electrode portion 22A indicates, out of the main gate electrode portion 22A, the bottom surface of the first portion embedded in the opening 25. In other words, the bottom surface of the main gate electrode portion 22A indicates, out of the main gate electrode portion 22A, a portion that is in contact with the surface of the semiconductor gate layer 21. The relative positional relation between the bottom surface of the ridge portion 21A and the insulator 7 and the relative positional relation between the bottom surface of the main gate electrode portion 22A and the insulator 7, when viewed in plan, are similar to those in the first embodiment. Therefore, the bottom surface of the main gate electrode portion 22A is disposed in a region other than the positions right above crystal defects in the ridge portion 21A, thereby allowing to increase the gate rated voltage in the second embodiment.

As illustrated in FIGS. 13 and 15, out of the semiconductor gate layer 21, regions which extend outward beyond the region where the main source electrode portion 3A and the drain electrode 4 face each other as illustrated in FIGS. 13 and 15 will be referred to as "extension regions S." Each extension region S includes the corresponding end portions of the paired ridge portions 21A and the connecting portion 21B corresponding the end portions.

In each extension region S, the insulating layer 24B is formed on substantially the entirety of the surface of the semiconductor gate layer 21. In this embodiment, the insulating layer 24B is formed on the entire area of the surface of the corresponding connecting portion 21B included in the extension region S. As a consequence, the area of a region where the semiconductor gate layer 21 and the gate electrode 22 are out of contact from each other is greater than the area of a region where the semiconductor gate layer 21 and the gate electrode 22 are in contact with each other.

In the second embodiment, gate leakage currents at the extension regions S can be suppressed, thereby allowing to increase the gate rated voltage further.

FIGS. 16A through 16E are cross-sectional views for describing an example of a manufacturing method of the above-described nitride semiconductor apparatus 1 according to the second embodiment, and illustrate cross-sectional structures at plural stages in the manufacturing method. FIGS. 16A through 16E are cross-sectional views corresponding to the cross-section of FIG. 14.

Figure 16A:
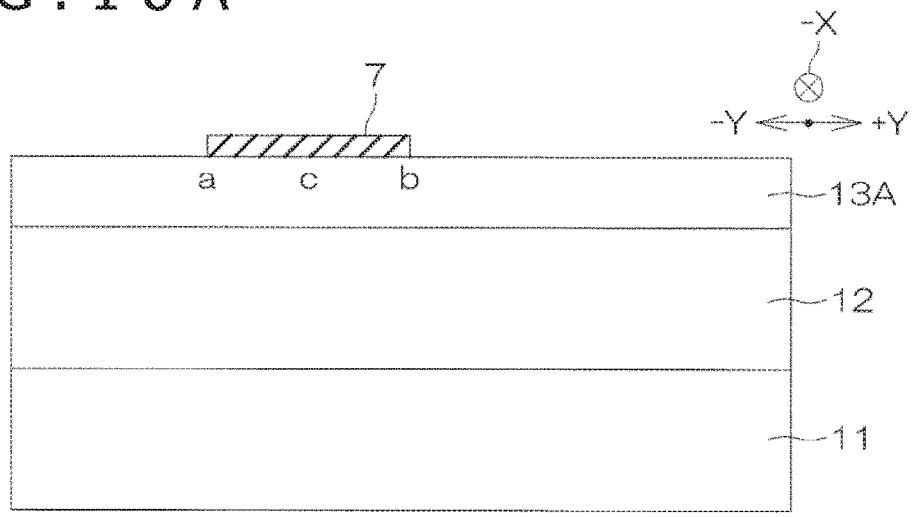
FIG. 16A is a cross-sectional view illustrating a step in a manufacturing method of the nitride semiconductor apparatus of FIG. 14, and corresponding to the cross-section of FIG. 14.

First, as illustrated in FIG. 16A, the buffer layer 12 and the lower layer 13A of the first nitride semiconductor layer 13 are epitaxially grown on the substrate 11 by the MOCVD method. The insulator 7 of the strip shape when viewed in plan is then formed in a predetermined region on the lower layer 13A. The insulator 7 is formed, for example, from SiN.

Figure 16B:
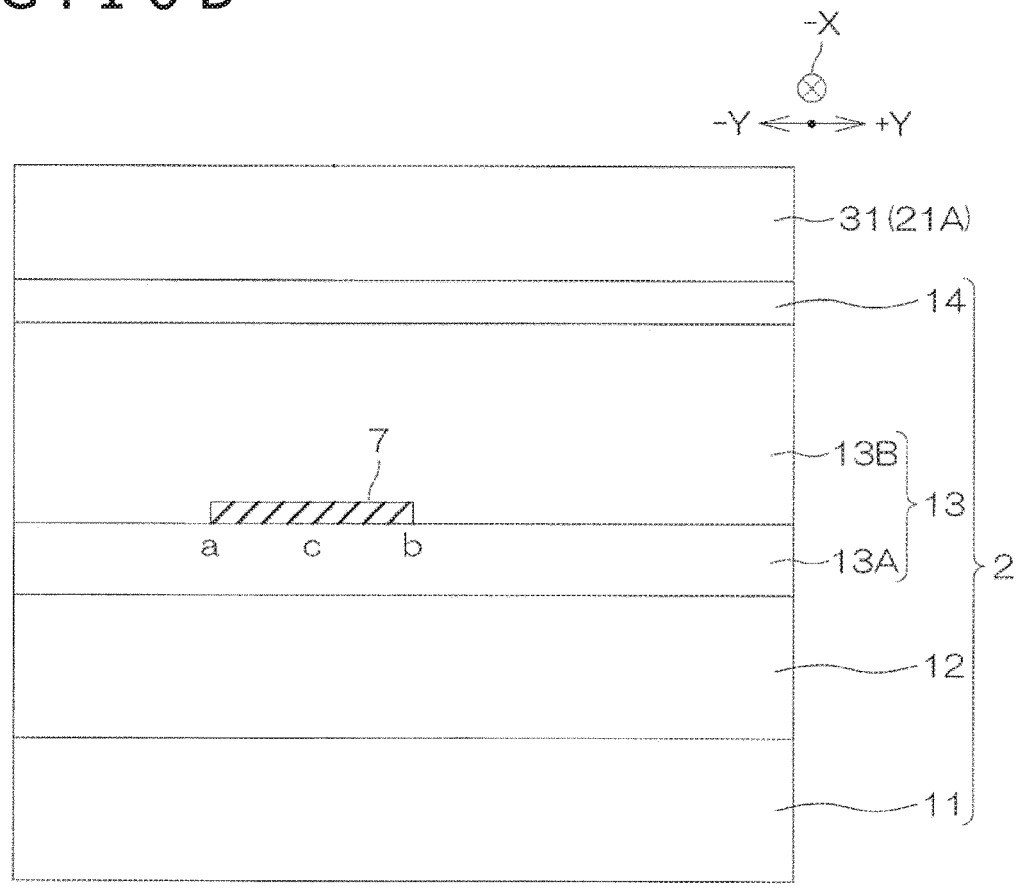
FIG. 16B is a cross-sectional view illustrating a step next to that of FIG. 16A.

Next, as illustrated in FIG. 16B, the upper layer 13B of the first nitride semiconductor layer 13 is epitaxially grown on the lower layer 13A of the first nitride semiconductor layer 13 to cover the insulator 7. Further, the second nitride semiconductor layer 14 is epitaxially grown on the upper layer 13B. As a consequence, the semiconductor stack structure 2 is obtained. Further, the gate layer material film 31, which is the material film for the semiconductor gate layer 21, is epitaxially grown on the second nitride semiconductor layer 14. In this embodiment, the gate layer material film 31 is a p-type GaN film.

Figure 16C:
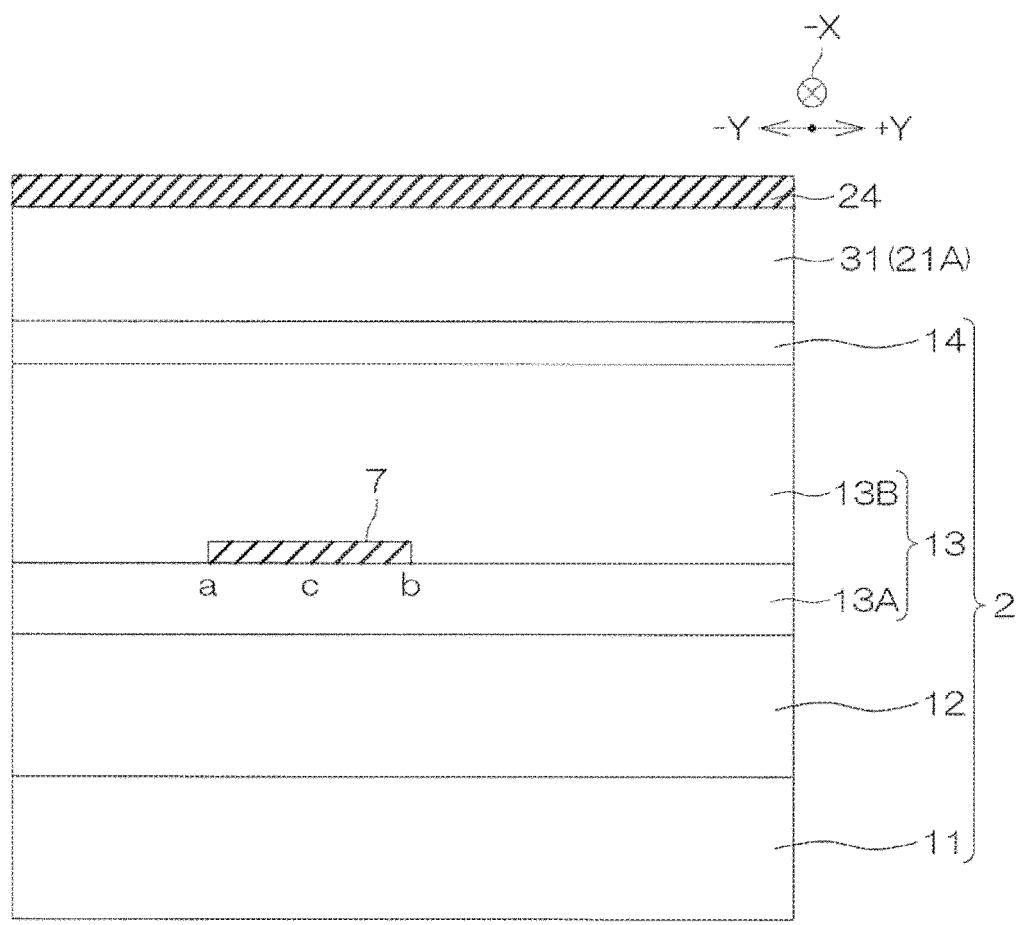
FIG. 16C is a cross-sectional view illustrating a step next to that of FIG. 16B.

Next, as illustrated in FIG. 16C, an insulating layer (third insulating layer) 24 is formed on the gate layer material film 31. The insulating layer (third insulating layer) 24 is a material layer for the insulating layers 24A and 24B, and is formed from SiN.

Figure 16D:
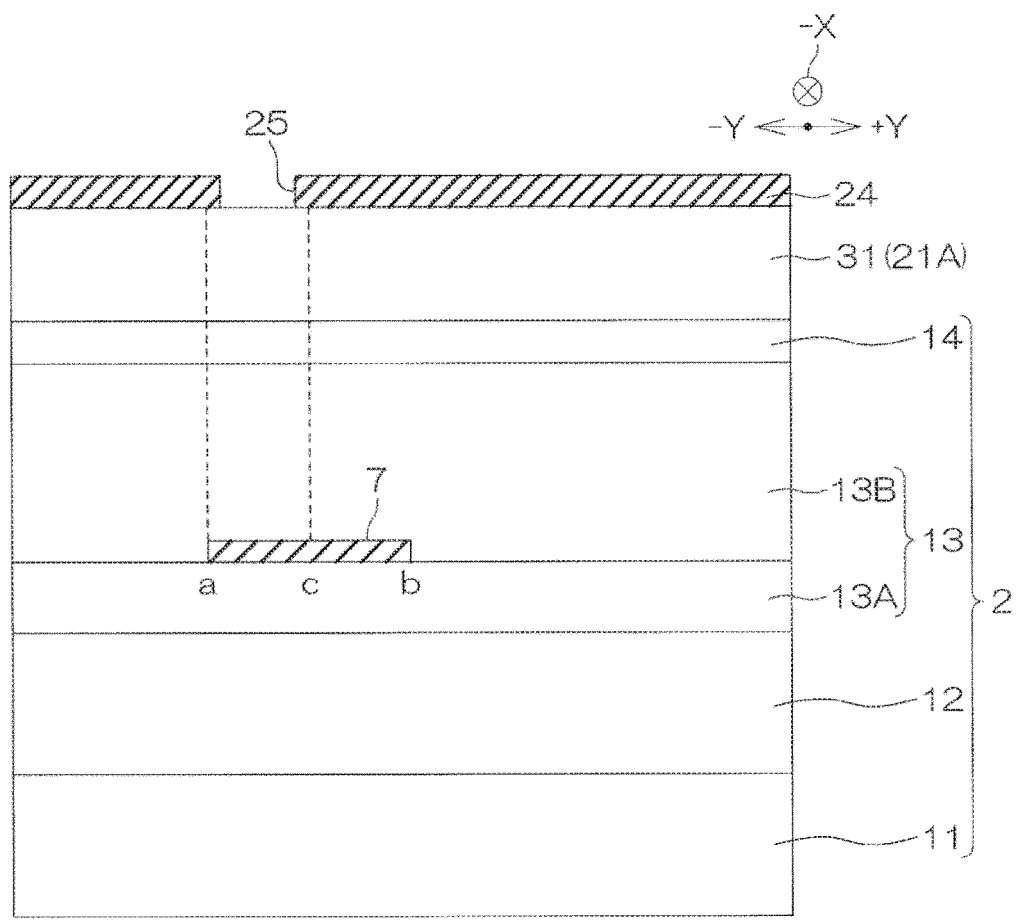
FIG. 16D is a cross-sectional view illustrating a step next to that of FIG. 16C.

Next, as illustrated in FIG. 16D, the opening 25 is formed through the insulating layer 24.

Figure 16E:
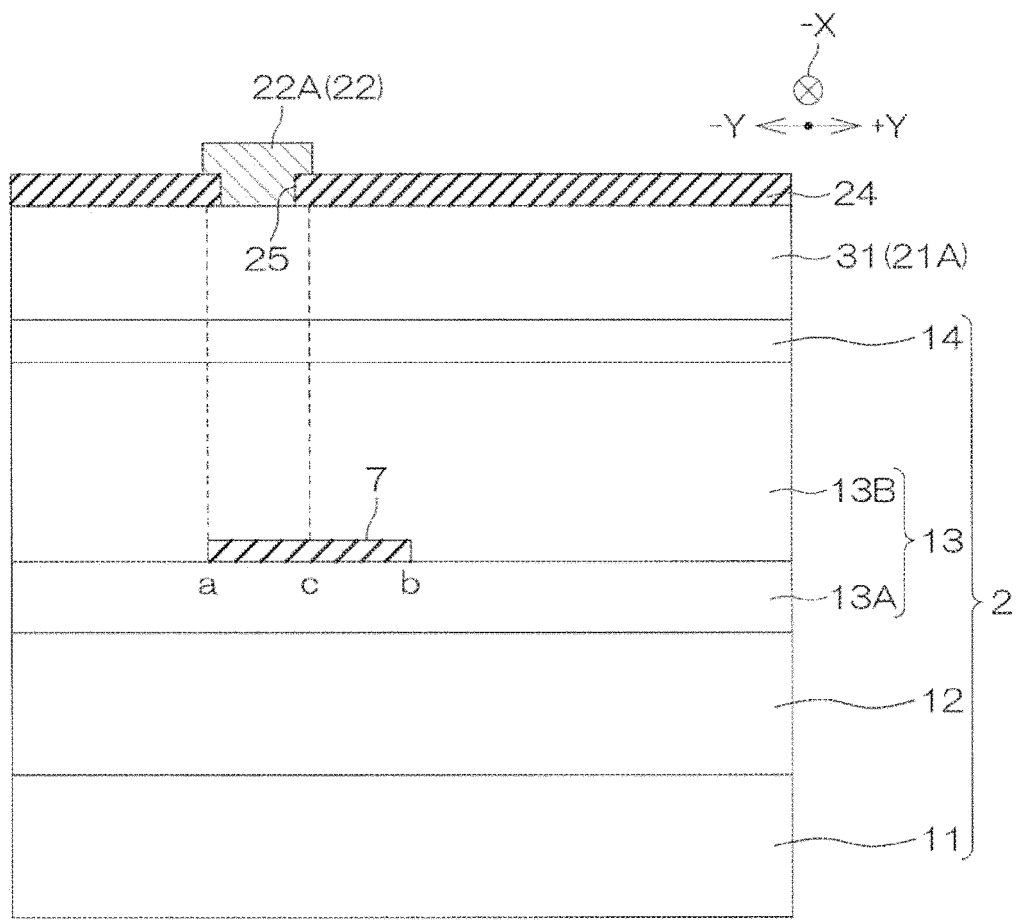
FIG. 16E is a cross-sectional view illustrating a step next to that of FIG. 16D.

Next, as illustrated in FIG. 16E, a gate electrode film, which is a material film for the gate electrode 22, is formed on the gate layer material film 31 by a sputtering method to cover the opening 25. The gate electrode film is then selectively etched, whereby the gate electrode 22 is formed.

Figure 16F:
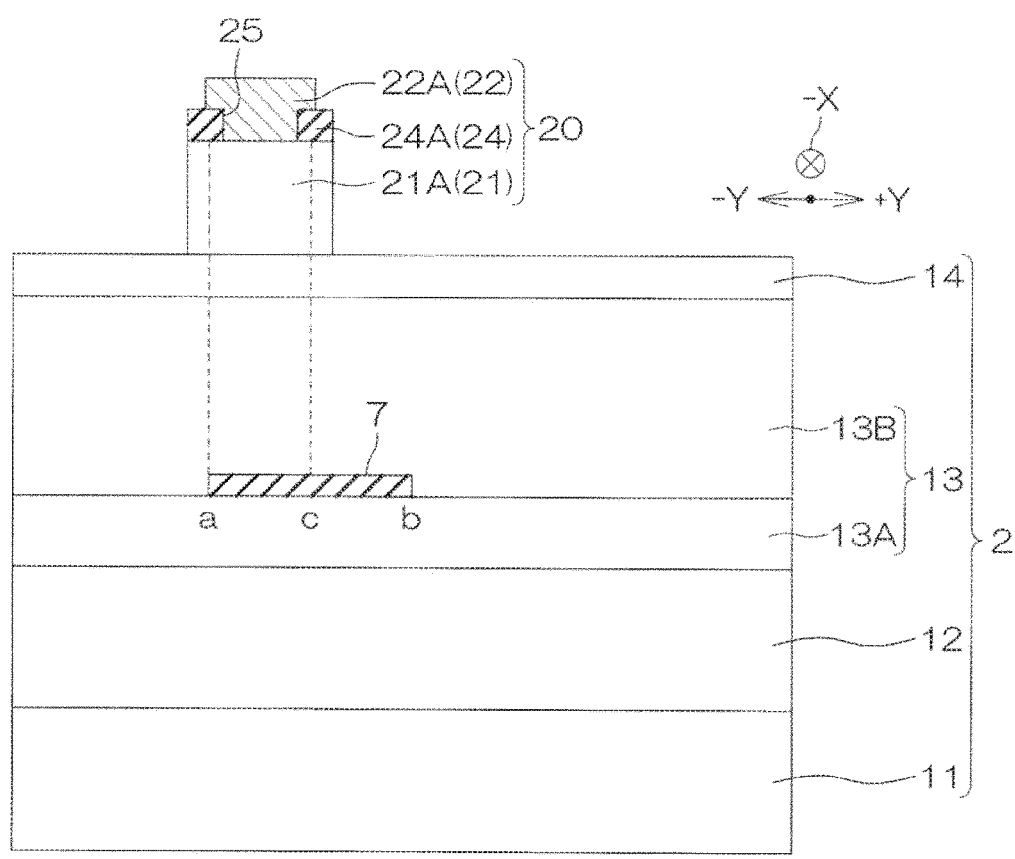
FIG. 16F is a cross-sectional view illustrating a step next to that of FIG. 16E.

Next, as illustrated in FIG. 16F, the insulating layer 24 and the gate layer material film 31 are selectively etched, whereby the insulating layer 24A, the insulating layer 24B which does not appear in FIG. 16F, and the semiconductor gate layer 21 are formed. As a consequence, the gate portion 20 is obtained, which is formed of the ridge portion 21A of the semiconductor gate layer 21, the insulating layers 24A formed on both the opposite side areas on the surface of the semiconductor gate layer 21, and the main gate electrode portion 22A formed to cover the opening 25.

Figure 16G:
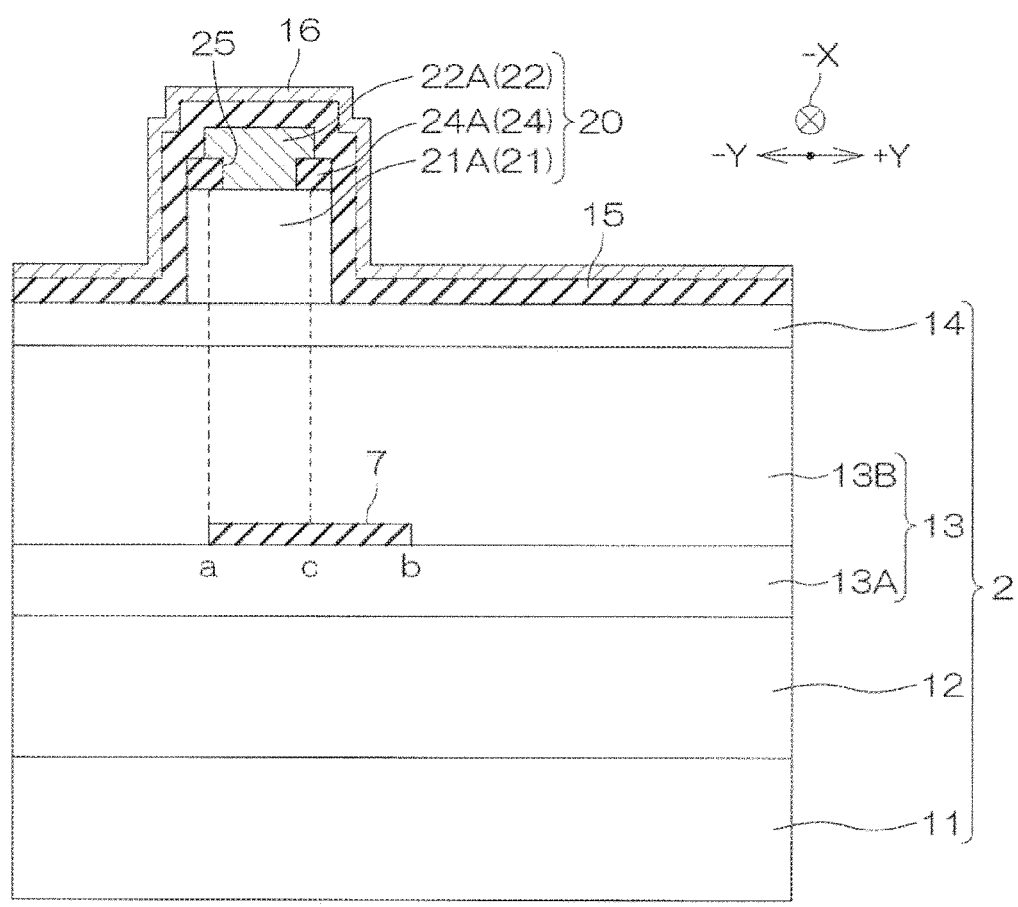
FIG. 16G is a cross-sectional view illustrating a step next to that of FIG. 16F.

Next, as illustrated in FIG. 16G, the passivation film 15 is formed to cover the exposed surfaces in their entirety. The passivation film 15 is formed, for example, from SiN. Further, the barrier metal film 16 is formed on the passivation film 15. The barrier metal film 16 is formed, for example, from TiN.

Figure 16H:
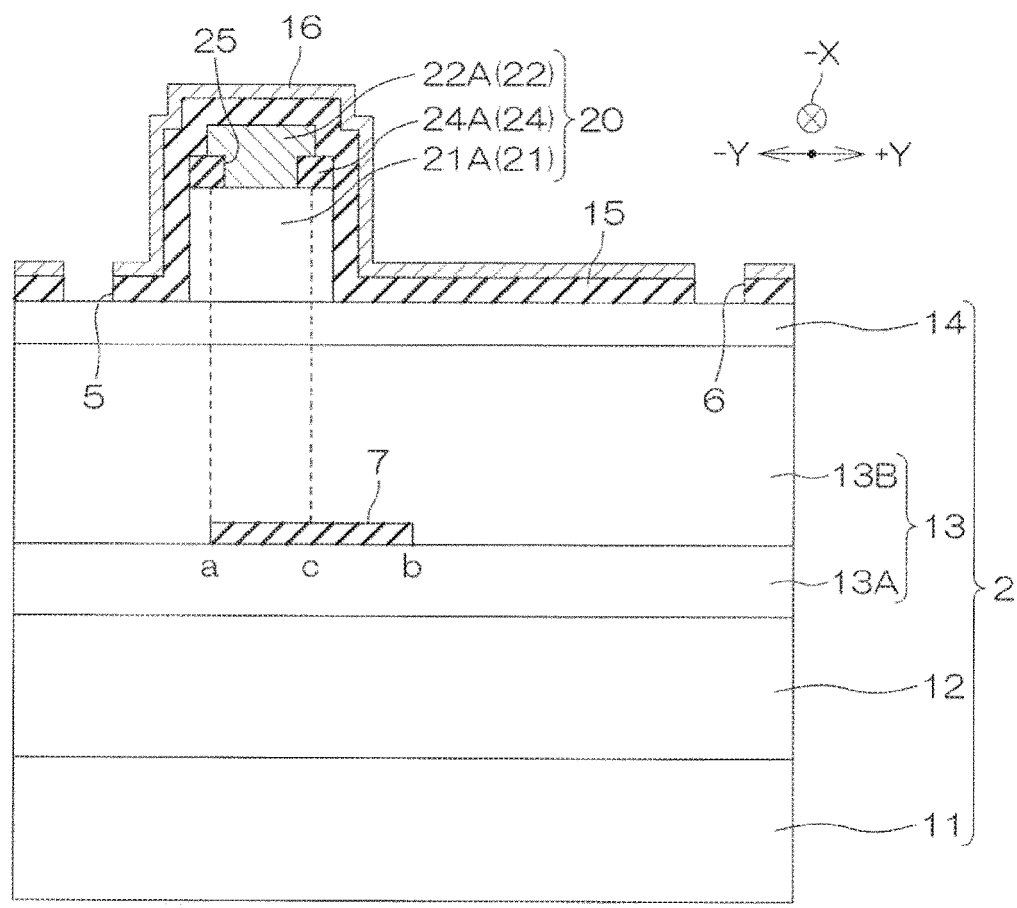
FIG. 16H is a cross-sectional view illustrating a step next to that of FIG. 16G.

Next, as illustrated in FIG. 16H, through the barrier metal film 16 and the passivation film 15, the source contact hole 5 and the drain contact hole 6 are formed extending to the second nitride semiconductor layer 14.

Figure 16I:
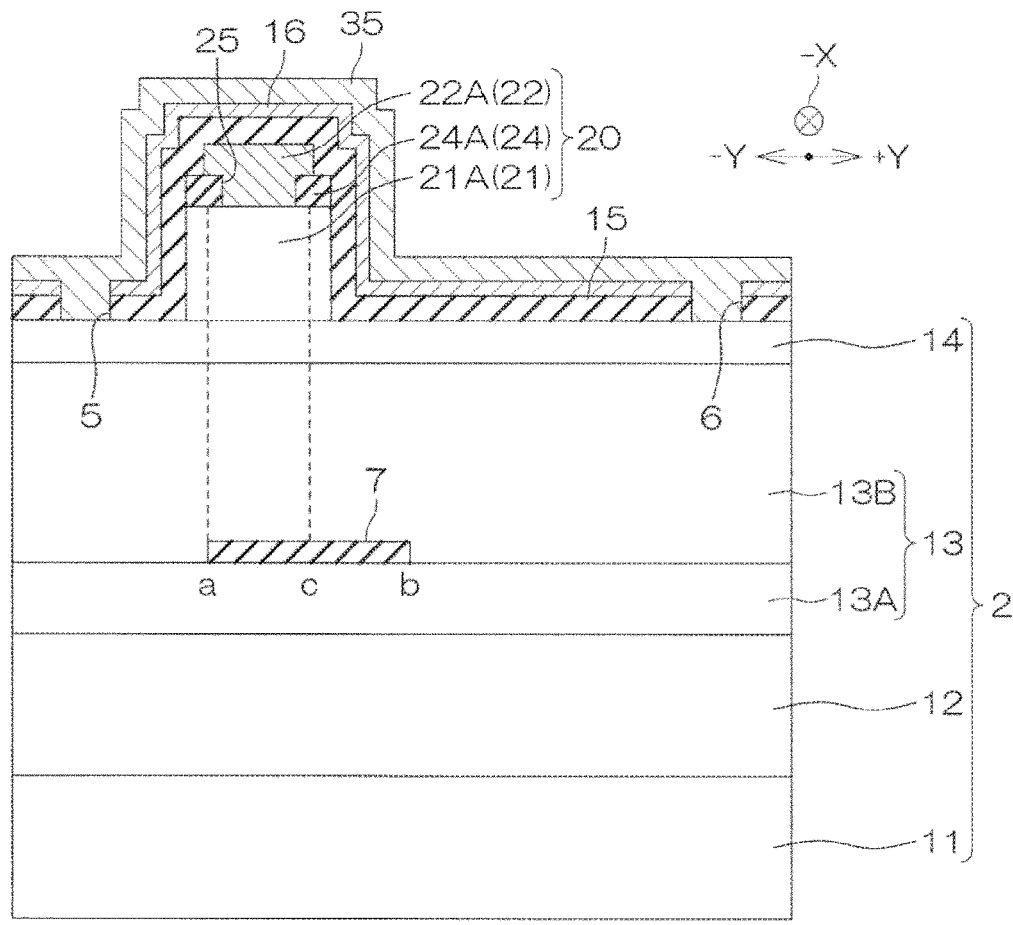
FIG. 16I is a cross-sectional view illustrating a step next to that of FIG. 16H.

Next, as illustrated in FIG. 16I, the source/drain electrode film 35 is formed to cover the exposed surfaces in their entirety.

Finally, the source electrode 3 and the drain electrode 4 are formed in contact with the second nitride semiconductor layer 14 through pattering of the source/drain electrode film 35 and the barrier metal film 16 by photolithography and etching. As a consequence, the nitride semiconductor apparatus 1G is obtained with such a structure as illustrated in FIG. 14.

Concerning the relative positional relation between the bottom surface of the ridge portion 21A (main gate electrode portion 22A) and the insulator 7, modifications similar to those of FIGS. 5 through 11 described above may be made to the second embodiment.

Figure 17:
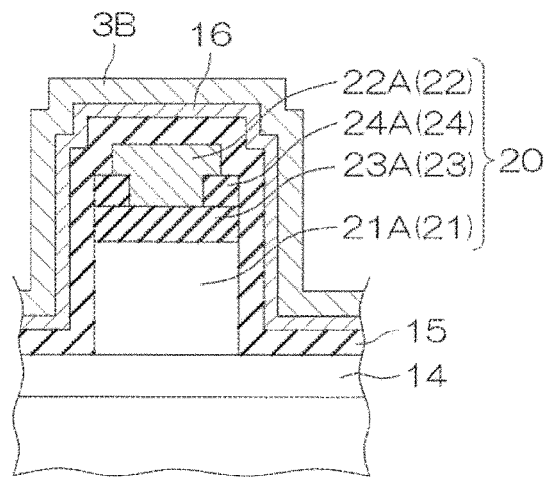
FIG. 17 is a fragmentary cross-sectional view illustrating an alternative modification of the gate portion.

FIG. 17 is a fragmentary cross-sectional view illustrating an alternative modification of the gate portion.

The semiconductor gate layer 21 in the nitride semiconductor apparatus 1H illustrated in FIG. 14 is assumed to be the first semiconductor gate layer 21. On the first semiconductor gate layer 21, the second semiconductor gate layer 23 is stacked. The second semiconductor gate layer 23 has a ridge portion 23A formed on the ridge portion 21A and a connecting portion (not illustrated) formed on the connecting portion 21B.

The second semiconductor gate layer 23 is formed from a nitride semiconductor having a greater band gap than the first semiconductor gate layer 21. The second semiconductor gate layer 23 is formed, for example, from $Al_{x2}Ga_{1-x2}N$ ($0 \leq x2 < 1$).

The gate portion 20 is formed from the ridge portion 21A of the first semiconductor gate layer 21, the ridge portion 23A of the second semiconductor gate layer 23 formed on the ridge portion 21A, the paired insulating layers formed on both the opposite side portions of the ridge portion 23A, and the main gate electrode portion 22A formed on the ridge portion 23A to cover the opening 25.

The main gate electrode portion 22A is in Schottky contact with the surface of the second semiconductor gate layer 23. This configuration can reduce a leakage current because the injection of holes from the gate electrode 22 into the first semiconductor gate layer 21 can be suppressed by the second semiconductor gate layer 23.

The first and second embodiments of the present disclosure have been described above. However, the present disclosure can also be practiced in other embodiments. For example, silicon is exemplified as an example of the material of the substrate 11 in the embodiments described above. In addition, desired substrate materials such as sapphire and GaN can also be applied.

In the first and second embodiments described above, the insulator 7 is formed in the first nitride semiconductor layer (electron transit layer) 13 at an intermediate position in the thickness direction thereof. However, the insulator 7 may also be formed on the surface of the substrate 11, or may also be formed on the surface of the buffer layer 12. In other words, the insulator 7 may be required to be formed between the substrate 11 and the surface layer portion of the first nitride semiconductor layer 13.

In addition, a variety of design changes can be applied to the first and second embodiments within the scope of the present disclosure as defined in the appended claims.

It should be understood by those skilled in the art that various modifications, combinations, sub-combinations and alterations may occur depending on design requirements and other factors insofar as they are within the scope of the appended claims or the equivalent thereof.

What is claimed is:

1. A nitride semiconductor apparatus, comprising:
    a substrate;
    a first nitride semiconductor layer above the substrate, wherein the first nitride semiconductor layer constitutes an electron transit layer;
    a second nitride semiconductor layer on the first nitride semiconductor layer, wherein the second nitride semiconductor layer constitutes an electron supply layer;
    a nitride semiconductor gate layer on the second nitride semiconductor layer, wherein the nitride semiconductor gate layer includes a ridge portion and an acceptor-type impurity;
    a gate electrode on the ridge portion;
    a source electrode that includes:
        a first portion in contact with the second nitride semiconductor layer, and
        a second portion above the gate electrode;
    a drain electrode opposite to the source electrode on the second nitride semiconductor layer, wherein the ridge portion is between the first portion of the source electrode and the drain electrode; and
    a strip-shaped insulator between the substrate and a surface layer portion of the first nitride semiconductor layer, wherein
        the strip-shaped insulator extends along a length direction of the ridge portion in a plan view,
        the strip-shaped insulator is below the gate electrode, and
        the strip-shaped insulator has a width greater than twice a width of a bottom surface of the gate electrode.

2. The nitride semiconductor apparatus according to claim 1, wherein
    the strip-shaped insulator includes: a first side edge and a second side edge,
    the bottom surface of the gate electrode is disposed right above an intermediate region between the first side edge and a widthwise center of the strip-shaped insulator or right above an intermediate region between the second side edge and the widthwise center, and
    the bottom surface of the gate electrode does not exist right above the first side edge, the widthwise center, and the second side edge in the strip-shaped insulator.

3. The nitride semiconductor apparatus according to claim 1, wherein
    the strip-shaped insulator includes a first side edge and a second side edge, and
    in the plan view, the first side edge and a widthwise center of the strip-shaped insulator exist inside both opposite side edges of the ridge portion, or the second side edge and the widthwise center exist inside both the opposite side edges of the ridge portion.

4. The nitride semiconductor apparatus according to claim 1, wherein in the plan view, only one of a first side edge, a widthwise center, or a second side edge of the strip-shaped insulator exists inside both opposite side edges of the ridge portion.

5. The nitride semiconductor apparatus according to claim 1, wherein
    the strip-shaped insulator includes a first side edge and a second side edge,
    the ridge portion has a bottom surface disposed right above an intermediate region between the first side edge and a widthwise center of the strip-shaped insulator or right above an intermediate region between the second side edge and the widthwise center, and the bottom surface of the ridge portion does not exist right above the first side edge, the widthwise center, and the second side edge in the strip-shaped insulator.

6. The nitride semiconductor apparatus according to claim 1, wherein in the plan view:
the nitride semiconductor gate layer is disposed to surround a main portion of the source electrode, and a distance between a first side edge of the strip-shaped insulator, and a widthwise center of the ridge portion is greater than a distance between a second side edge of the strip-shaped insulator and the widthwise center of the ridge portion, the first side edge is on a side of the drain electrode, and the second side edge is on a side of the source electrode.

7. The nitride semiconductor apparatus according to claim 1, wherein the nitride semiconductor gate layer has an extension region extending outward beyond a region where the source electrode and the drain electrode oppose each other, and in the extension region, a region where the nitride semiconductor gate layer and the gate electrode are out of contact has a greater area than a region where the nitride semiconductor gate layer and the gate electrode are in contact with each other.

8. The nitride semiconductor apparatus according to claim 1, wherein the gate electrode is in Schottky contact with a surface of the nitride semiconductor gate layer.

9. The nitride semiconductor apparatus according to claim 1, wherein when the nitride semiconductor gate layer is assumed to be a first nitride semiconductor gate layer, a second nitride semiconductor gate layer having a greater band gap than the first nitride semiconductor gate layer is formed on the first nitride semiconductor gate layer, the gate electrode is formed on the second nitride semiconductor gate layer, and the gate electrode is in contact with a surface of the second nitride semiconductor gate layer.

10. The nitride semiconductor apparatus according to claim 1, wherein the width of the strip-shaped insulator is 3 µm or smaller.

11. The nitride semiconductor apparatus according to claim 1, wherein the width of the strip-shaped insulator is 2 µm or smaller.

12. The nitride semiconductor apparatus according to claim 1, wherein the strip-shaped insulator is formed from one of SiO2, SiN, SiON, Al2O3, AlN, or AlON.

13. The nitride semiconductor apparatus according to claim 1, further comprises a buffer layer disposed between the substrate and the first nitride semiconductor layer.

14. The nitride semiconductor apparatus according to claim 13, wherein the buffer layer includes a first buffer layer and a second buffer layer, the first buffer layer is in contact with a surface of the substrate, and the second buffer layer is stacked on a surface of the first buffer layer.

15. The nitride semiconductor apparatus according to claim 14, wherein the first buffer layer is an AlN film.

16. The nitride semiconductor apparatus according to claim 14, wherein the first buffer layer has a thickness of 100 nm to 500 nm.

17. The nitride semiconductor apparatus according to claim 14, wherein the second buffer layer is a composite film of AlGaN.

18. The nitride semiconductor apparatus according to claim 14, wherein the second buffer layer has a thickness of 500 nm to 2 µm.

19. The nitride semiconductor apparatus according to claim 1, wherein the first nitride semiconductor layer is a GaN layer.

20. The nitride semiconductor apparatus according to claim 1, wherein the first nitride semiconductor layer has a thickness of 0.5 µm to 2 µm.

21. The nitride semiconductor apparatus according to claim 1, wherein the second nitride semiconductor layer is a $Al_{x1}Ga_{1-x1}N$ layer ($0<x1<1$).

22. The nitride semiconductor apparatus according to claim 1, wherein the second nitride semiconductor layer has a thickness of 5 nm to 25 nm.

23. The nitride semiconductor apparatus according to claim 1, further comprises a passivation film that covers exposed surfaces of each of the second nitride semiconductor layer, the nitride semiconductor gate layer, and the gate electrode.

24. The nitride semiconductor apparatus according to claim 23, wherein the passivation film is a single film of one of SiN, $SiO_2$, or SiON or a composite film of at least two of SiN, $SiO_2$, or SiON.

25. The nitride semiconductor apparatus according to claim 23, wherein the passivation film has a thickness of 50 nm to 200 nm.

26. The nitride semiconductor apparatus according to claim 23, further comprises a barrier metal film above the passivation film.

27. The nitride semiconductor apparatus according to claim 26, wherein the barrier metal film is a TiN layer.

28. The nitride semiconductor apparatus according to claim 26, wherein the barrier metal film has a thickness of 10 nm to 50 nm.

29. The nitride semiconductor apparatus according to claim 1, wherein the strip-shaped insulator includes a first side edge a second side edge, a center between the first side edge and the second side edge is a widthwise center, the bottom surface of the gate electrode does not exist right above the first side edge, the widthwise center, and the second side edge in the strip-shaped insulator, and the bottom surface of the gate electrode is disposed in an intermediate region between the first side edge and the widthwise center of the strip-shaped insulator.

30. The nitride semiconductor apparatus according to claim 1, wherein the source electrode is beyond the gate electrode, and an edge of the source electrode faces an edge of the drain electrode.

* * * * *